(12) United States Patent
Stockstad et al.

(10) Patent No.: US 7,333,781 B1
(45) Date of Patent: Feb. 19, 2008

(54) POWER CORRECTION LOOP FOR A POWER AMPLIFIER

(75) Inventors: Troy Stockstad, Chandler, AZ (US); Alexander Wayne Hietala, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 471 days.

(21) Appl. No.: 11/100,089

(22) Filed: Apr. 6, 2005

(51) Int. Cl.
    *H04B 1/04* (2006.01)
(52) U.S. Cl. ............... 455/126; 455/127.2; 330/129; 330/149
(58) Field of Classification Search ............... None
    See application file for complete search history.

(56) References Cited

U.S. PATENT DOCUMENTS 5,278,994 A    1/1994  Black et al. .............. 455/126
5,748,037 A *  5/1998  Rozental et al. ............ 330/2
6,476,677 B1  11/2002  Komaili et al. ........... 330/279
2005/0206447 A1 * 9/2005  Yamazaki et al. ......... 330/129

* cited by examiner

*Primary Examiner*—Thanh Cong Le
(74) *Attorney, Agent, or Firm*—Withrow & Terranova, PLLC

(57) ABSTRACT

A system is provided for correcting an output power of a power amplifier in a transmit chain of a mobile terminal. In one embodiment, the system includes output power correction circuitry that corrects the output power of the power amplifier during ramp-up for a transmit burst. The output power of the power amplifier is controlled based on a power control signal, which is provided by combining an amplitude component of a modulated signal and a corrected ramping signal provided by the output power correction circuitry. In general, a power amplifier ramp generator provides a ramping signal. The ramping signal is converted to a desired output power signal, which is subtracted from a detected output power signal to provide an error signal. The error signal is integrated to provide an adjustment signal, which is combined with an ideal ramping signal to provide the corrected ramping signal.

20 Claims, 12 Drawing Sheets

US 7,333,781 B1

POWER CORRECTION LOOP FOR A POWER AMPLIFIER

FIELD OF THE INVENTION

The present invention relates to a transmitter for a mobile terminal, and more particularly relates to a system for correcting an output power of a power amplifier in the transmit chain of the mobile terminal to correct for variations in output power due to variations in load impedance.

BACKGROUND OF THE INVENTION

Battery-life and Output Radio Frequency Spectrum (ORFS) are two important criteria for determining the performance of a mobile terminal, such as a mobile telephone or the like. Both battery-life and ORFS may be adversely affected by a varying Voltage Standing Wave Ratio (VSWR) at the output of a power amplifier in the transmit chain of the mobile terminal. The VSWR may vary due to environmental factors such as the user placing an antenna of the mobile terminal near his or her body. As a result of the varying VSWR, the load impedance seen at the antenna also varies from an ideal load, such as 50 ohms.

For open loop power amplifiers, the variations in VSWR cause the output power of the power amplifier to deviate from the target output power. This deviation from output power decreases the quality of service (QoS), increases the probability of dropped calls in fringe areas, increases the liability of mobile terminal manufacturers in terms of tolerated output power versus Specific Absorption Ratio (SAR), and increases the peak current of the power amplifier. Thus, there remains a need for power amplifier control circuitry that reduces or eliminates output power variations due to variations in load impedance.

SUMMARY OF THE INVENTION

The present invention provides a system and corresponding method for correcting an output power of a power amplifier in a transmit chain of a mobile terminal. In one embodiment, the system includes an all digital output power correction circuit that corrects the output power of the power amplifier circuitry during ramp-up for a transmit burst. In general, the output power of the power amplifier circuitry is controlled based on a power control signal, where the power control signal is provided by combining a corrected ramping signal and an amplitude component of a modulated signal. The output power correction circuit operates to adjust a magnitude of an ideal ramping signal based on a difference between a detected output power signal and a desired output power signal to provide the corrected ramping signal. More specifically, integration circuitry integrates the difference between the detected output power signal and the desired output power signal to provide an adjustment signal. The adjustment signal is combined with the ideal ramping signal to provide the corrected ramping signal having a magnitude corresponding to the desired, or target, output power.

In one embodiment, the output power correction circuit includes time alignment circuitry that operates to time align the desired output power signal and the detected output power signal. The detected output power signal may be provided based on a power detection signal, such as a power detection signal from a directional coupler at the output of the power amplifier circuitry, or a detected output current signal indicative of an output current of the power amplifier circuitry.

In another embodiment, the system also includes over current detection and correction circuit and over voltage detection and correction circuit operating to adjust the ramping signal during ramp-up for a transmit burst in order to prevent over current and over voltage conditions due to variations in load impedance.

In yet another embodiment, the output power correction circuit operates to correct the output power of the power amplifier circuitry during the entire transmit burst. In this embodiment, the output power correction circuit operates to provide a corrected composite signal rather than a corrected ramping signal, where the power control signal is provided based on the corrected composite signal. More specifically, the output power correction circuit combines an amplitude component of a modulated signal and a ramping signal to provide a composite signal. The output power correction circuit operates to process the composite signal and provide the corrected composite signal corresponding to the desired, or target, output power based on a difference between a detected output power signal and a desired output power signal.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
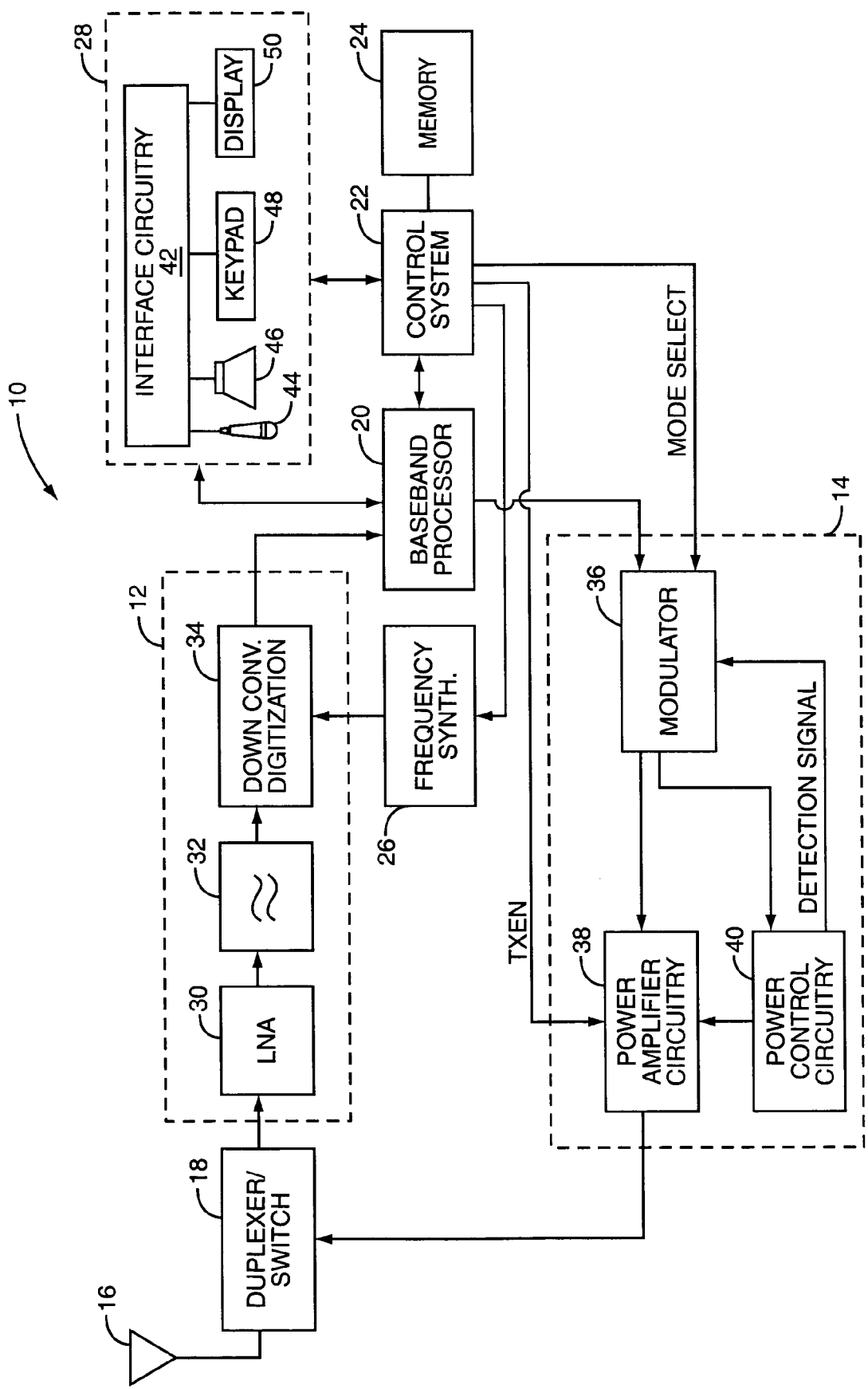
FIG. 1 illustrates an exemplary mobile terminal according to one embodiment of the present invention.

The present invention is preferably incorporated in a mobile terminal 10, such as a mobile telephone, personal digital assistant, wireless Local Area Network (LAN) device, a base station in a mobile network, or the like. The basic architecture of a mobile terminal 10 is represented in FIG. 1, and may include a receiver front end 12, a radio frequency transmitter section 14, an antenna 16, a duplexer or switch 18, a baseband processor 20, a control system 22, memory 24, a frequency synthesizer 26, and an interface 28. The receiver front end 12 receives information bearing radio frequency signals from one or more remote transmitters provided by a base station (not shown). A low noise amplifier 30 amplifies the signal. A filter circuit 32 minimizes broadband interference in the received signal, while a downconverter 34 downconverts the filtered, received signal to an intermediate or baseband frequency signal, which is then digitized into one or more digital streams. The receiver front end 12 typically uses one or more mixing frequencies generated by the frequency synthesizer 26.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The control system 22 may run software stored in the memory 24. Alternatively, the operation of the control system 22 may be a function of sequential logic structures as is well understood. After encoding the data from the control system 22, the baseband processor 20 outputs the encoded data to the radio frequency transmitter section 14.

A modulator 36 receives the data from the baseband processor 20 and operates according to one or more modulation schemes to provide a modulated signal to the power amplifier circuitry 38. The modulation scheme of the modulator 36 may be controlled by a mode select signal (MODE SELECT) from the control system 22. In one embodiment, the modulator 36 operates according to either an 8-Level Phase Shift Keying (8PSK) modulation scheme, which is a modulation scheme containing both amplitude and phase components, or a Gaussian Minimum Shift Keying (GMSK) modulation scheme, which is a constant amplitude modulation scheme.

When in 8PSK mode, the modulator 36 provides a phase component, or a phase modulation signal, at a desired transmit frequency to the power amplifier circuitry 38 and an amplitude component, or amplitude modulation signal, to the power control circuitry 40. The power control circuitry 40 controls an output power of the power amplifier circuitry 38 based on the amplitude component or, optionally, a combination of a ramping signal and the amplitude component, thereby providing amplitude modulation of the phase component. When in GMSK mode, the modulator 36 provides a phase modulation signal to the power amplifier circuitry 38 and the ramping signal to the power control circuitry 40, where the power control circuitry 40 controls the output power of the power amplifier circuitry 38 based on the ramping signal.

The power amplifier circuitry 38 amplifies the modulated signal from the modulator 36 to a level appropriate for transmission from the antenna 16. A gain of the power amplifier circuitry 38 is controlled by the power control circuitry 40. In essence, the power control circuitry 40 operates to control a supply voltage provided to the power amplifier circuitry 38 based on the amplitude component or, optionally, a combination of the amplitude component and the ramping signal from the modulator 36 when in the 8PSK mode and based on the ramping signal when in GMSK mode.

A user may interact with the mobile terminal 10 via the interface 28, which may include interface circuitry 42 associated with a microphone 44, a speaker 46, a keypad 48, and a display 50. The interface circuitry 42 typically includes analog-to-digital converters, digital-to-analog converters, amplifiers, and the like. Additionally, it may include a voice encoder/decoder, in which case it may communicate directly with the baseband processor 20.

The microphone 44 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 46 by the interface circuitry 42. The keypad 48 and display 50 enable the user to interact with the mobile terminal 10, input numbers to be dialed and address book information, or the like, as well as monitor call progress information.

Figure 2:
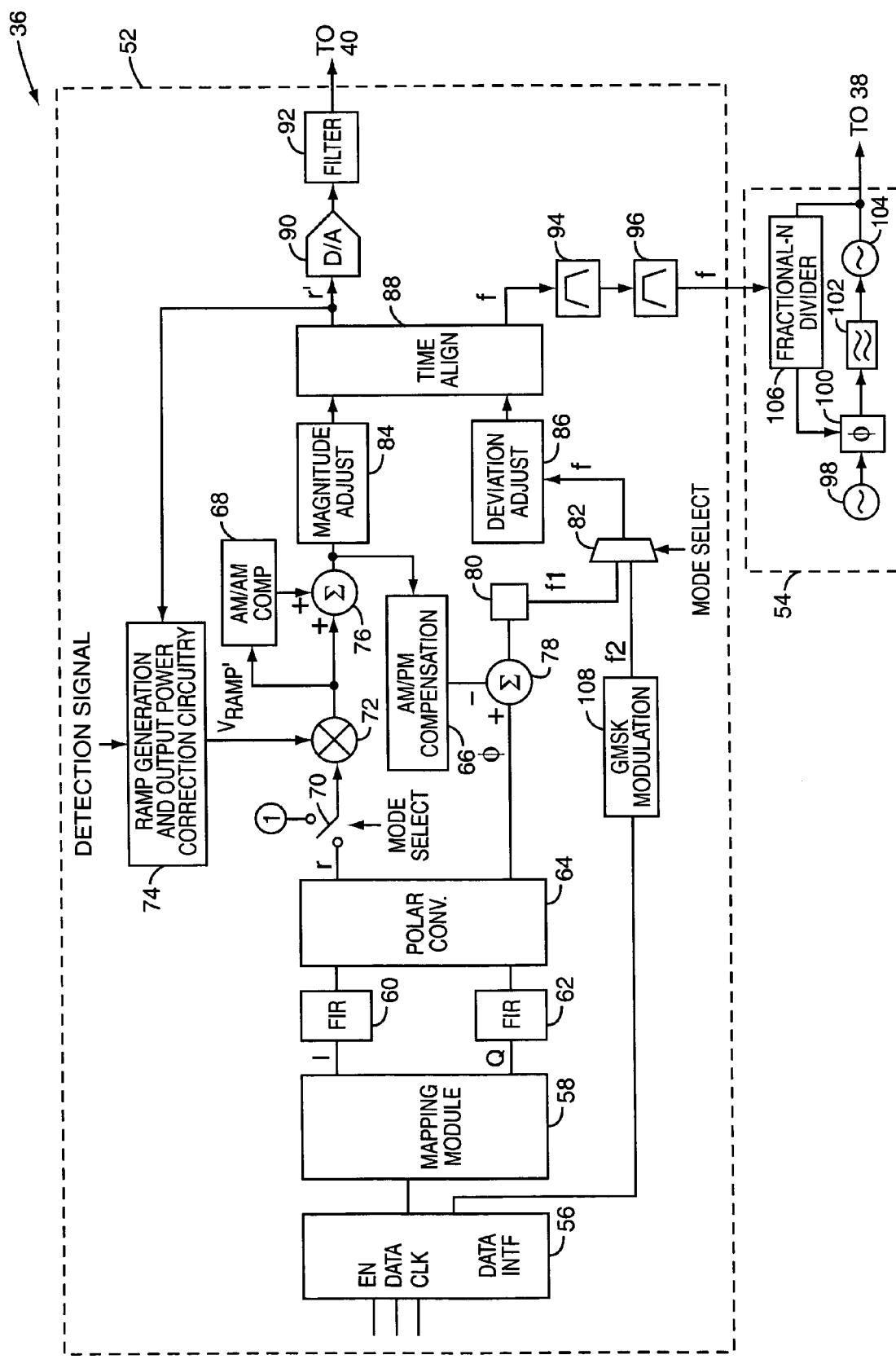
FIG. 2 illustrates an exemplary modulator including ramp generation and output power correction circuitry according to one embodiment of the present invention.

FIG. 2 illustrates an exemplary embodiment of the modulator 36, wherein the modulator 36 includes digital modulation circuitry 52 and a phase locked loop (PLL) 54. The modulator 36 operates in either an 8PSK (8-Level Phase Shift Keying) mode or GMSK (Gaussian Minimum Shift Keying) mode. It should be noted that 8PSK and GMSK are exemplary modulation schemes and are not intended to limit the scope of the present invention. The modulator 36 includes several components, including a data interface 56, a mapping module 58, first and second filters 60, 62, and a polar converter 64. Other components of the modulator 36 will be discussed below. It should be noted that the data interface 56 may include First In First Out (FIFO) circuitry or may alternatively be a real time serial data interface.

The mapping module 58, the filters 60, 62, and the polar converter 64 form an 8PSK modulator. As discussed below, in this embodiment, the 8PSK modulator also includes amplitude modulation to phase modulation (AM/PM) compensation circuitry 66, amplitude modulation to amplitude modulation (AM/AM) compensation circuitry 68, and various other components as described below.

When in 8PSK mode, the data interface 56 receives data from the baseband processor 20 (FIG. 1) at the bit rate of the system. This data is passed to the mapping module 58, where the data is grouped into symbols of three consecutive data bits, Grey coded, and rotated by $3\pi/8$ on each symbol as per European Telecommunications Standards Institute (ETSI) specifications. The resulting symbol is mapped to one of sixteen points in an in-phase (I), quadrature phase (Q) constellation.

Both the in-phase (I) and the quadrature phase (Q) components for each point are then filtered by the first and second filters 60, 62, respectively. In an exemplary embodiment, the first and second filters 60, 62 are Enhanced Data Rates for GSM Evolution (EDGE) finite impulse response (FIR) filters. This, as dictated by the ETSI specifications, shapes the response between symbol times.

After filtering, both the in-phase (I) and the quadrature phase (Q) components are sent to the polar converter 64. The polar converter 64 uses a classical coordinate rotation digital computer (CORDIC) algorithm or like rectangular to polar conversion technique. Thus, the polar converter 64 generates phase ($\phi$) and amplitude (r) equivalent signals. Further information about CORDIC algorithms may be found in *Proceedings of the 1998 ACM/SIGDA Sixth International Symposium On Field Programmable Gate Arrays* by Ray Andraka, Feb. 22-24, pp. 191-200 and "The CORDIC Trigonometric Computing Technique" by Jack E. Volder *IRE Trans on Elect. Computers*, p. 330, 1959, both of which are hereby incorporated by reference in their entireties.

Figure 12:
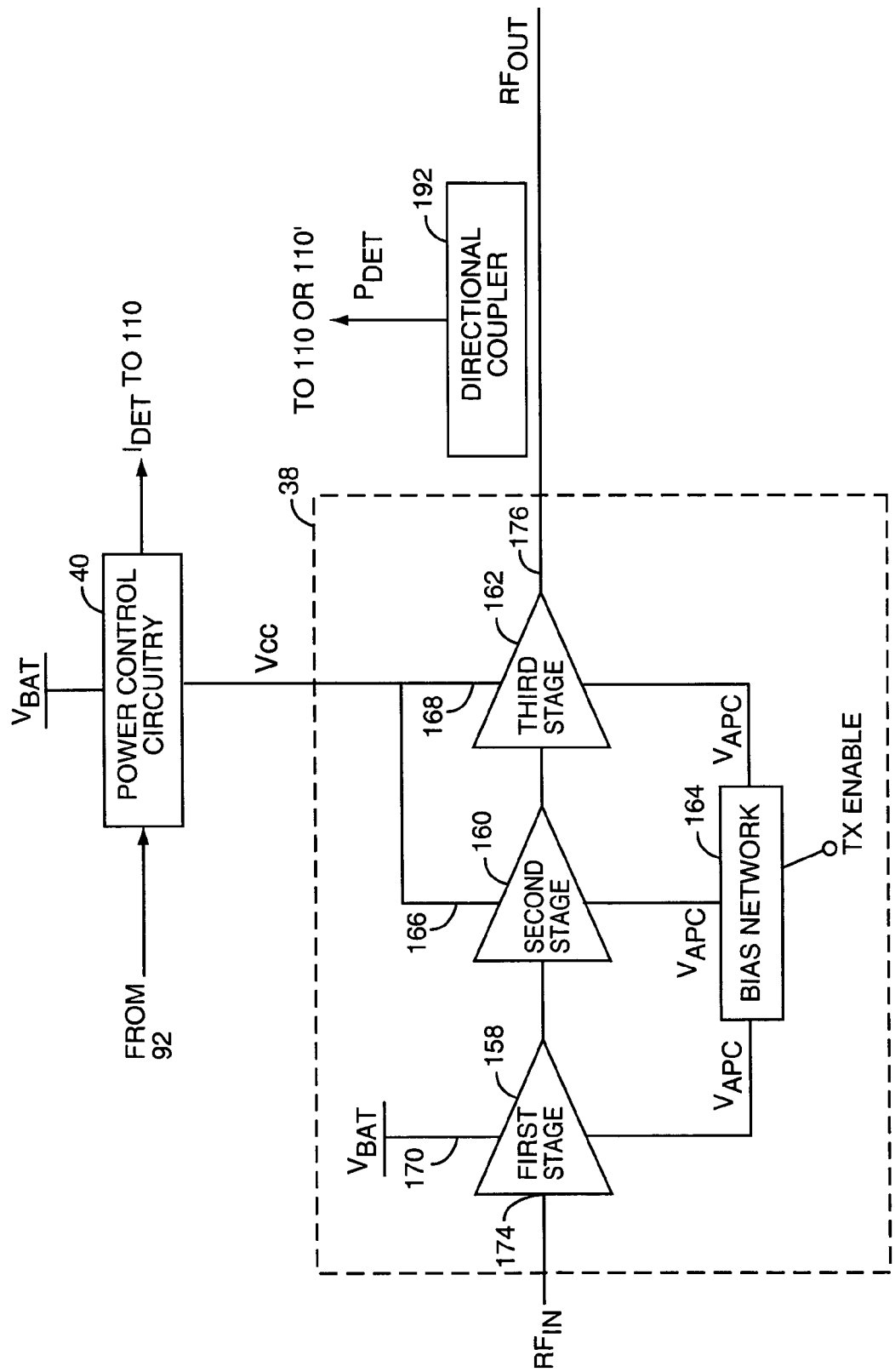
FIG. 12 illustrates an exemplary embodiment of a system for detecting the output power of a power amplifier using a directional coupler according to one embodiment of the present invention.

When in 8PSK mode, switch 70 is controlled by the mode select signal (MODE SELECT) such that the amplitude signal (r) is provided to multiplier 72. The multiplier 72 combines the amplitude signal (r) with a corrected ramping signal ($V'_{RAMP}$) generated by ramp generation and output power correction circuitry 74 to provide a composite amplitude signal. As discussed below in more detail, the ramp generation and output power correction circuitry 74 detects and corrects over current conditions based on a detection signal (DETECTION SIGNAL) provided from either the power control circuitry 40 (FIG. 1) or a directional coupler 174 (FIG. 12). The ramp generation and output power correction circuitry 74 detects and corrects over voltage conditions based on the digital amplitude modulation signal (r'). In addition, the ramp generation and output power correction circuitry 74 may correct the output power of the power amplifier circuitry 38 (FIG. 1) based on the detection signal (DETECTION SIGNAL) such that the output power of the power amplifier circuitry 38 is essentially equal to the desired, or target, output power.

The composite amplitude signal from the multiplier 72 is directed to the AM/AM compensation circuitry 68 and summation circuitry 76. The AM/AM compensation circuitry 68 introduces a compensation term to the composite amplitude signal via the summation circuitry 76 that, after further processing, counteracts the distortion introduced by AM/AM conversion in the power amplifier circuitry 38. The compensated amplitude signal from the summation circuitry 76 is provided to the AM/PM compensation circuitry 66. The AM/PM compensation circuitry 66 introduces a compensation term to the phase signal via subtraction circuitry 78 that, after further processing, counteracts the distortion introduced by AM/PM conversion in the power amplifier circuitry 38. Further details of the AM/PM compensation circuitry 66 and the AM/AM compensation circuitry 68 can be found in commonly owned and assigned U.S. Patent Application Publication No. 2003/0215025, entitled AM TO PM CORRECTION SYSTEM FOR POLAR MODULATOR, published Nov. 20, 2003; and U.S. Patent Application Publication No. 2003/0215026, entitled AM TO AM CORRECTION SYSTEM FOR POLAR MODULATOR, published Nov. 20, 2003, both of which are hereby incorporated by reference in their entireties.

The output of the subtraction circuitry 78, which is referred to herein as the compensated phase signal, is directed to a phase to frequency converter 80. The output of the phase to frequency converter 80 is a frequency signal (f1), which generally corresponds to the desired frequency deviation of the modulated signal. The frequency signal (f1) is provided to a multiplexer switch 82, which is controlled by the mode select signal (MODE SELECT). When in the 8PSK mode, the mode select signal (MODE SELECT) is provided such that the multiplexer switch 82 outputs the frequency signal (f1) from the phase to frequency converter 80.

Magnitude adjuster 84 and deviation adjuster 86 then adjust the magnitude of the compensated amplitude signal from the summation circuitry 76 and the frequency deviation of the frequency signal (f), respectively, to a level expected by a time aligner 88, such that they comply with the appropriate standard. Next, a relative time delay is applied as necessary to the signals for best Error Vector Magnitude (EVM) and spectrum by the time aligner 88, such that the time aligner 88 provides a digital amplitude modulation signal (r') and a digital frequency signal (f). The digital frequency signal (f) is a magnitude adjusted, time aligned version of the output of the multiplexer switch 82. Because these are preferably digital components, concerns about variations in analog components and the corresponding variation in time delays downstream are minimized.

At this point, the amplitude modulation signal (r') and the frequency signal (f) separate and proceed by different paths, an amplitude signal processing path and a frequency signal processing path, to the power amplifier circuitry 38. With respect to the amplitude signal processing path, when in the 8PSK mode, the amplitude modulation signal (r') is provided to a digital-to-analog (D/A) converter 90. The output of the D/A converter 90 is filtered by low-pass filter 92 to provide an analog power control signal. In one embodiment, the D/A converter 90 is a sigma delta converter, and thus the output of the D/A converter 90 is a single Pulse Width Modulated (PWM) digital output signal having a carrier frequency, such as 78 MHz. The PWM digital output signal is then filtered by the low-pass filter 92 to remove the carrier frequency and provide the analog power control signal proportional to the PWM variation. The analog power control signal is used by the power control circuitry 40 to set the collector voltage on the power amplifier circuitry 38. As the amplitude modulation signal (r') changes, the voltage at the power amplifier circuitry 38 collector changes, and the output power will vary as $V^2/R_{out}$ ($R_{out}$ is not shown, but is effectively the load on the power amplifier circuitry 38). This is sometimes known as "plate modulation".

The frequency signal (f) from the time aligner 88 is directed to a digital filter 94 and a digital predistortion filter 96. The digital filter 94 is optional depending on the particular design. Thereafter, the frequency signal (f), which is a digital signal, is provided to a phase locked loop (PLL) 54 to provide direct digital modulation similarly to that described in commonly owned and assigned U.S. Pat. No. 6,834,084, entitled DIRECT DIGITAL POLAR MODULATOR, issued Dec. 21, 2004, which is hereby incorporated herein by reference in its entirety. In one embodiment, the data interface 56 provides a digital data interface to the baseband processor 20 (FIG. 1), and the entire phase path from the data interface 56 to the PLL 54 is a digital path.

Based on the frequency signal (f), the PLL 54 generates a phase modulation signal at the desired radio frequency. In the exemplary embodiment illustrated, the PLL 54 includes a reference oscillator 98, a phase detector 100, a loop filter 102, a voltage controlled oscillator (VCO) 104, and a fractional-N divider 106. The operational details of the PLL 54 will be apparent to one of ordinary skill in the art upon reading this disclosure. In general, the phase detector 100 compares a phase of a reference signal provided by the reference oscillator 98 with a divided signal provided by the fractional-N divider 106. Based on the comparison of the reference signal and the divided signal, the phase detector 100 provides a detection signal to the loop filter 102. The loop filter 102, which is a low pass filter, operates to filter the detection signal to provide a control signal to the VCO 104.

The PLL 54 illustrated in FIG. 2 is merely exemplary. In an alternative embodiment, the PLL 54 is the Fractional-N Offset PLL (FN-OPLL) described in commonly owned and assigned U.S. patent application Ser. No. 11/047,258 entitled FRACTIONAL-N OFFSET PHASE LOCKED LOOP, which was filed on Jan. 31, 2005 and is hereby incorporated by reference in its entirety. In another embodiment, the PLL 54 may be like that disclosed in commonly owned and assigned U.S. patent application Ser. No. 10/070,074 entitled CLOSED LOOP POLAR MODULATION SYSTEM WITH OPEN LOOP OPTION AT LOW POWER LEVELS, which was filed on Mar. 2, 2005 and is hereby incorporated by reference in its entirety, such that the radio frequency transmitter section 14 may operate as either a closed loop polar modulator where the power amplifier circuitry 38 is enclosed within the loop of the PLL 54, or as an open loop polar modulator similar to that illustrated in FIG. 2.

When in GMSK mode, the switch 70 is controlled by the mode select signal (MODE SELECT) such that the multiplier 72 multiples the corrected ramping signal ($V'_{RAMP}$) by "1" rather than by the amplitude signal (r). The modulator 36 also includes a GMSK modulator, which includes GMSK modulation circuitry 108. The GMSK modulation circuitry 108 processes the data to generate a frequency signal (f2). In one embodiment, the GMSK modulation circuitry 108 is a look-up table. Another exemplary embodiment of the GMSK modulation circuitry 108 is discussed in U.S. Pat. No. 5,825,257, entitled GMSK MODULATOR FORMED OF PLL TO WHICH CONTINUOUS MODULATED SIGNAL IS APPLIED, issued Oct. 20, 1998, which is hereby incorporated by reference in its entirety. It should be appreciated that other embodiments of the GMSK modulation circuitry 108 may also be used, and the particular circuitry is not central to the present invention.

The output of the GMSK modulation circuitry 108, which is the frequency signal (f2), is provided to the multiplexer switch 82. In GMSK mode, the multiplexer switch 82 outputs the frequency signal (f2) from the GMSK modulation circuitry 108. As discussed above, the adjusters 84, 86 then adjust the magnitude of the compensated amplitude signal and the deviation of the frequency signal (f2), respectively, to levels expected by the time aligner 88, such that they comply with the appropriate standard. Next, a relative time delay is applied as necessary to the signals for best Error Vector Magnitude (EVM) and spectrum by the time aligner 88.

At this point, the amplitude modulation signal (r') and the frequency signal (f) output by the time aligner 88 separate and proceed by different paths to the power amplifier circuitry 38. The amplitude modulation signal (r') is converted to the analog power control signal by the digital-to-analog converter 90 and filtered by the low-pass filter 92. The analog power control signal is used by the power control circuitry 40 to set the collector voltage on the power amplifier circuitry 38.

As in 8PSK mode, when in GMSK mode, the frequency signal (f) from the time aligner 88 is directed to the optional digital filter 94, the digital predistortion filter 96, and the PLL 54. The PLL 54 generates the phase modulation signal at the desired radio frequency. In an exemplary embodiment, the frequency signal is applied to a single port on the fractional-N divider 106 within the PLL 54.

Figure 3:
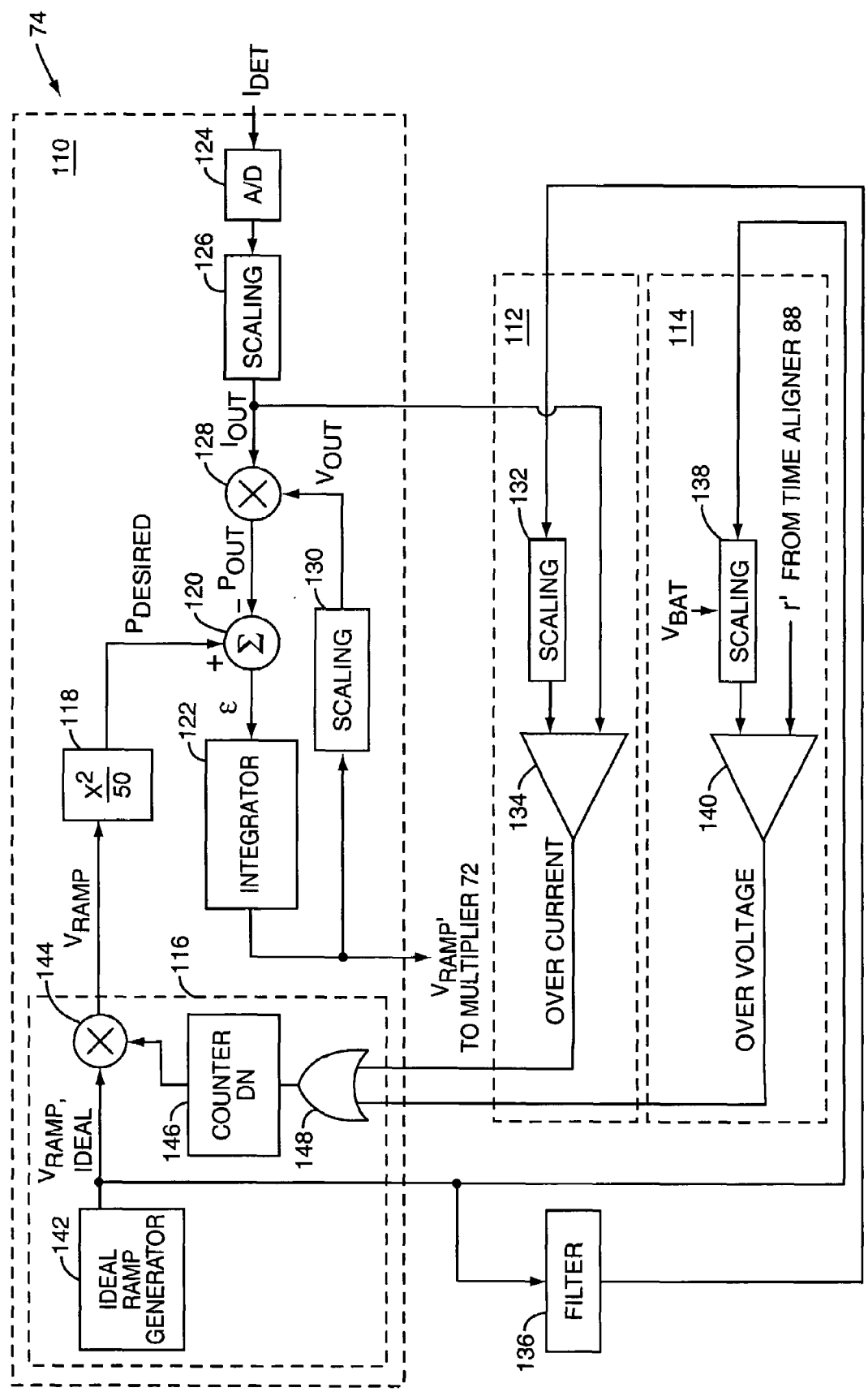
FIG. 3 illustrates the ramp generation and output power correction circuitry according to one embodiment of the present invention.

FIG. 3 illustrates the ramp generation and output power correction circuitry 74 according to one embodiment of the present invention. In general, the ramp generation and output power correction circuitry 74 includes output power correction circuitry 110, over current detection and correction circuitry 112, and over voltage detection and correction circuitry 114. In this embodiment, the output power correction circuitry 110, the over current detection and correction circuitry 112, and the over voltage detection and correction circuitry 114 operate during ramp-up for a transmit burst, and thereafter hold the corrected ramping signal ($V'_{RAMP}$) constant until ramp-down at the completion of the transmit burst. Further, in the preferred embodiment, the output power correction circuitry 110, the over current detection and correction circuitry 112, and the over voltage detection and correction circuitry 114 are all digital circuits.

The output power correction circuitry 110 operates to provide the corrected ramping signal ($V'_{RAMP}$) such that the output power of the power amplifier circuitry 38 (FIG. 1) is essentially equal to the target output power. This is beneficial because the load impedance, which is essentially the impedance seen at the antenna 16 (FIG. 1), may vary, thereby creating a varying Voltage Standing Wave Ratio (VSWR) at the output of the power amplifier circuitry 38. The output power correction circuitry 110 operates to provide the corrected ramping signal ($V'_{RAMP}$) such that the output power of the power amplifier circuitry 38 is essentially equal to the target output power regardless of variations in the load impedance.

Figure 4:
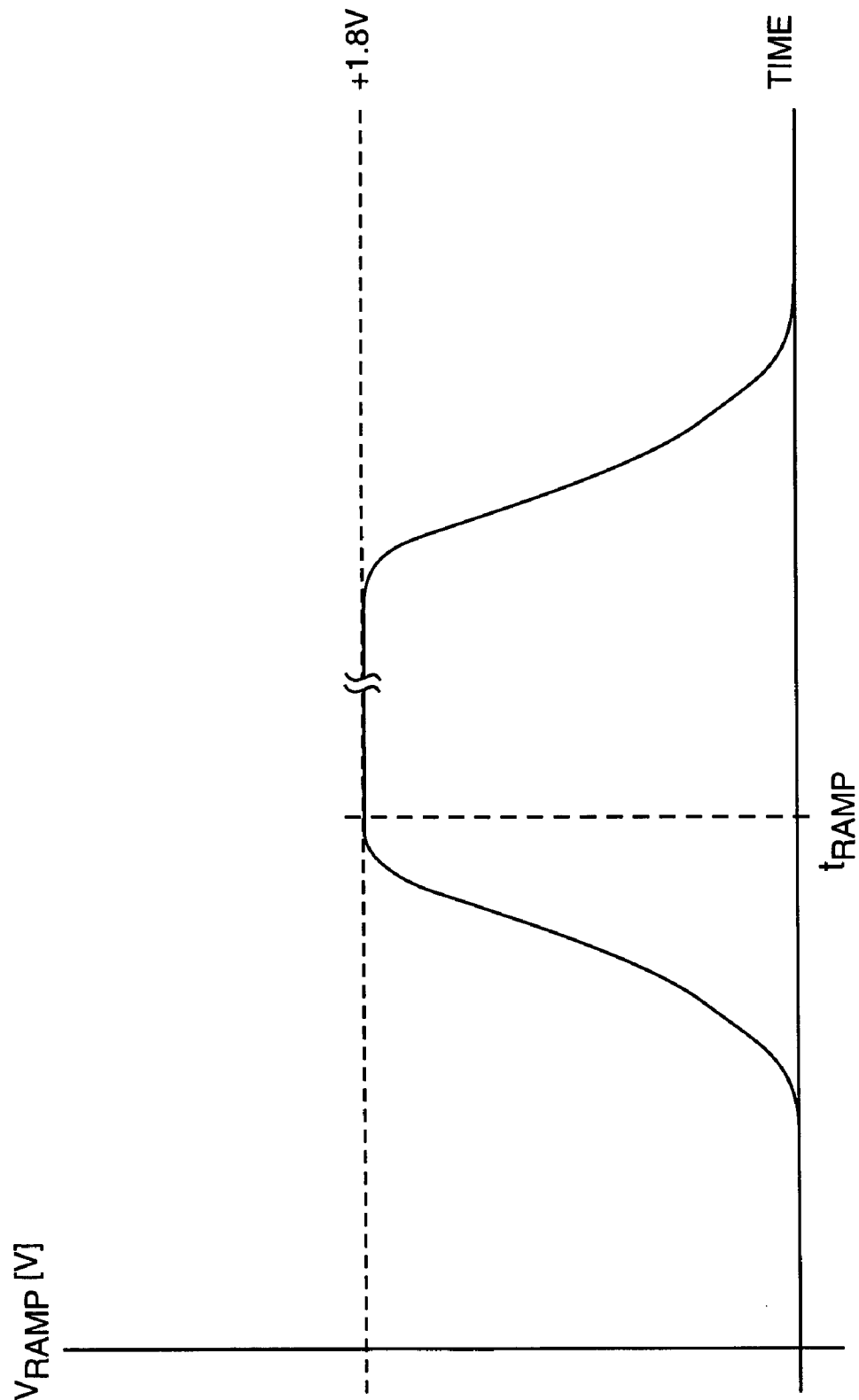
FIG. 4 is an exemplary illustration of a ramping signal ($V_{RAMP}$) for a transmit burst.

The output power correction circuitry 110 includes a power amplifier (PA) ramp generator 116 that provides an ideal ramping signal ($V_{RAMP,IDEAL}$) and a ramping signal ($V_{RAMP}$). The ramping signal ($V_{RAMP}$) is equivalent to the ideal ramping signal ($V_{RAMP,IDEAL}$) when no over current or over voltage condition exists. However, if an over current or over voltage condition is detected, the ramping signal ($V_{RAMP}$) may be reduced such that it is less than the ideal ramping signal ($V_{RAMP,IDEAL}$). An exemplary embodiment of the ramping signal ($V_{RAMP}$) is illustrated in FIG. 4, where $t_{RAMP}$ indicates the end of ramp-up for the transmit burst. Returning to FIG. 3, the PA ramp generator 116 provides the ramping signal ($V_{RAMP}$) based on an ideal load impedance, which may be 50 ohms. However, since the load impedance may vary, it may be desirable to correct the ramping signal ($V_{RAMP}$) such that the target output power is provided by the power amplifier circuitry 38 (FIG. 1), as described below.

The ramping signal ($V_{RAMP}$) is converted from a voltage to a desired output power signal ($P_{DESIRED}$) by conversion circuitry 118. The conversion circuitry 118 converts the ramping signal ($V_{RAMP}$) to the desired output power signal ($P_{DESIRED}$) based on the equation $X^2/50$, where 50 is the exemplary ideal load impedance. Subtraction circuitry 120, which may also be referred to as difference circuitry, subtracts an output power signal ($P_{OUT}$), which corresponds to the actual output power of the power amplifier circuitry 38 (FIG. 1), from the desired output power signal ($P_{DESIRED}$) to provide an error signal ($\epsilon$). An integrator 122 integrates the error signal ($\epsilon$) to provide the corrected ramping signal ($V'_{RAMP}$). By integrating the error signal ($\epsilon$), the output power correction circuitry 110 provides the corrected ramping signal ($V'_{RAMP}$) such that the corrected ramping signal ($V'_{RAMP}$) tracks the trajectory of the ramping signal ($V_{RAMP}$) but has a corrected magnitude to provide the target output power regardless of variations in the load impedance.

In this embodiment, the detection signal (DETECTION SIGNAL) (FIGS. 1 and 2) is a current detection signal ($I_{DET}$). The current detection signal ($I_{DET}$) is first converted from an analog signal to a digital signal by an analog-to-digital (A/D) converter 124. The digital current detection signal is scaled by scaling circuitry 126 to provide an output current signal ($I_{OUT}$) corresponding to the actual output current, or collector current, of the power amplifier circuitry 38 (FIG. 1). A multiplier 128 multiplies the output current signal ($I_{OUT}$) by an output voltage signal ($V_{OUT}$) to provide the output power signal ($P_{OUT}$) to the subtraction circuitry 120. The output voltage signal ($V_{OUT}$) corresponds to an output voltage of the power amplifier circuitry 38 (FIG. 1), and is provided by scaling circuitry 130. The scaling circuitry 130 operates to scale the corrected ramping signal ($V'_{RRAMP}$), which is indicative of the output voltage of the power amplifier circuitry 38 (FIG. 1), to provide the output voltage signal ($V_{OUT}$). In one embodiment, the scaling circuitries 126 and 130 operate to multiply their corresponding input signals by predetermined scaling factors to provide their corresponding output signals.

According to the present invention, the over current detection and correction circuitry 112 operates to detect when the output current, or collector current, of the power amplifier circuitry 38 (FIG. 1) exceeds a threshold current and, in response, control the PA ramp generator 116 to reduce the target output power. Before discussing the details of the over current detection and correction circuitry 112, it may be beneficial to discuss the concept of over current. As discussed above, the ramp generator operates to provide the ramping signal ($V_{RAMP}$) based on the ideal load impedance. However, due to various factors such as environmental conditions, the load impedance may actually be less than the ideal load impedance. When the load impedance is less than the ideal load impedance, the output power correction circuitry operates to modify the magnitude of the ramping signal ($V_{RAMP}$) to provide the corrected ramping signal ($V'_{RAMP}$) such that the supply voltage, or collector voltage, provided to the power amplifier circuitry 38 (FIG. 1) changes to achieve the target output power. However, as the load impedance falls further below the ideal load impedance, the output current of the power amplifier circuitry 38 (FIG. 1) continues to increase, thereby creating an excessive current drain on a battery powering the mobile terminal 10 and decreasing battery-life.

Figure 5A:
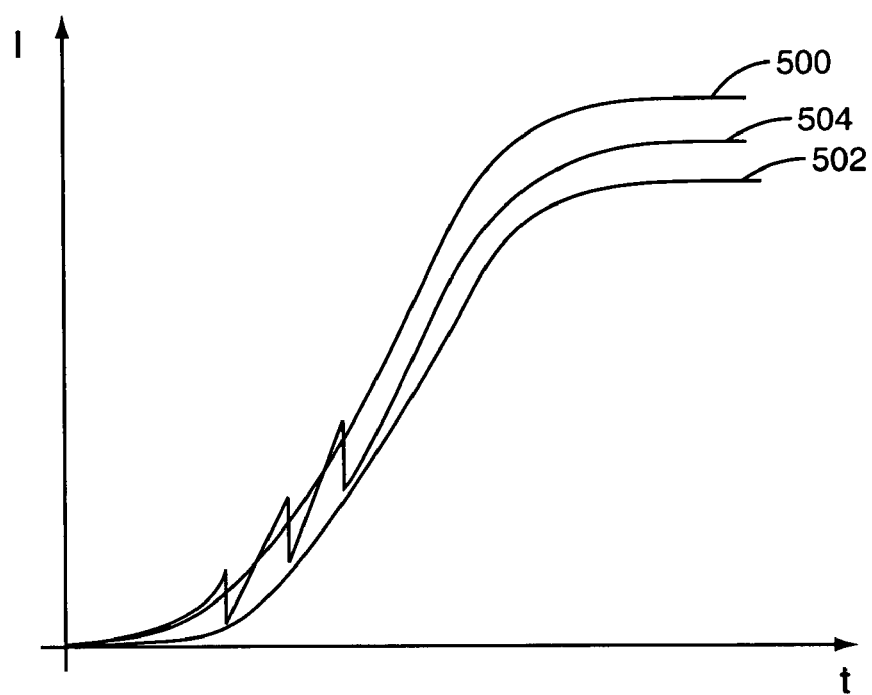
FIGS. 5A and 5B illustrate detection and correction of excess voltage or current according to one embodiment of the present invention.

The operation of the over current detection and correction circuitry 112 is best described with respect to FIG. 5A. Note that the over current detection and correction circuitry 112 operates only during ramp-up for a transmit burst. Based on the ideal ramping signal ($V_{RAMP,IDEAL}$), the over current detection and correction circuitry 112 generates a maximum current ramp (line 500). An ideal current ramp (line 502) for the ideal load impedance is also illustrated. At numerous points in time during ramp-up, the over current detection and correction circuitry 112 compares the detected output current ($I_{DET}$), which corresponds to a corrected, or actual, current ramp (line 504), to the maximum threshold current (line 500). If the detected output current ($I_{DET}$) exceeds the maximum current ramp (line 500), the over current detection and correction circuitry 112 communicates with the PA ramp generator 116 (FIG. 3) to reduce the target output power by reducing the magnitude of the ramping signal ($V_{RAMP}$) with respect to the ideal ramping signal ($V_{RAMP,IDEAL}$). As a result, the detected output current ($I_{DET}$) (line 504) is also reduced. By operating only during ramp-up and correcting for over current using multiple steps, the over current detection and correction circuitry 112 ensures that any disturbances in the output radio frequency spectrum (ORFS) of the power amplifier circuitry 38 (FIG. 1) are small.

Returning to FIG. 3, the details of the over current detection and correction circuitry 112 will now be described. The over current detection and correction circuitry 112 includes scaling circuitry 132 and comparator 134. The scaling circuitry 132 provides the maximum current ramp (FIG. 5A, 500) based on the ideal ramping signal ($V_{RAMP,IDEAL}$). More specifically, a low-pass filter 136, which is matched to the low-pass filter 92 (FIG. 2), filters the ideal ramping signal ($V_{RAMP,IDEAL}$) in order to compensate for the inherent delay of the low-pass filter 92. The scaling circuitry 132 provides the maximum current ramp (FIG. 5A, 500) based on the filtered, ideal ramping signal ($V_{RAMP,IDEAL}$).

At numerous points in time during ramp-up, the comparator 134 compares the output of the scaling circuitry 132, which is the maximum current ramp, to the detected output current from the scaling circuitry 126. If the detected output current exceeds the maximum threshold current, the comparator 134 provides an over current signal (OVER CURRENT) to the PA ramp generator 116. In response, the PA ramp generator 116 reduces the target output power by reducing the magnitude of the ramping signal ($V_{RAMP}$) with respect to the magnitude of the ideal ramping signal ($V_{RAMP,IDEAL}$).

The over voltage detection and correction circuitry 114 is similar to the over current detection and correction circuitry 112. According to the present invention, the over voltage detection and correction circuitry 114 operates to detect when the output voltage of the power amplifier circuitry 38 (FIG. 1) exceeds a threshold voltage and, in response, communicate with the PA ramp generator 116 to reduce the target output power. Before discussing the details of the over voltage detection and correction circuitry 114, it may be beneficial to discuss the concept of over voltage. As discussed above, the ramp generator operates to provide the ramping signal ($V_{RAMP}$) based on the ideal load impedance. However, due to various factors such as environmental conditions, the load impedance may actually be more than the ideal load impedance. When the load impedance is more than the ideal load impedance, the output power correction circuitry 110 operates to modify the magnitude of the ramping signal ($V_{RAMP}$) to provide the corrected ramping signal ($V'_{RAMP}$) such that the supply voltage, or collector voltage, provided to the power amplifier circuitry 38 (FIG. 1) changes to achieve the target output power. However, as the load impedance increases further above the ideal load impedance, the output current of the power amplifier circuitry 38 (FIG. 1) continues to decrease, thereby requiring a greater collector voltage to provide the target output power. As some point, the collector voltage reaches a maximum voltage corresponding to the voltage of the battery powering the mobile terminal 10. If this were allowed to occur, a time discontinuity in the collector voltage would occur when the voltage level is reached thereby causing a spectral glitch. In addition, when operating in 8PSK mode where there is amplitude modulation, the hard limit of the battery voltage will truncate the output waveform of the power amplifier circuitry 38 (FIG. 1) if the collector voltage is allowed to sufficiently approach the battery voltage.

Figure 5B:
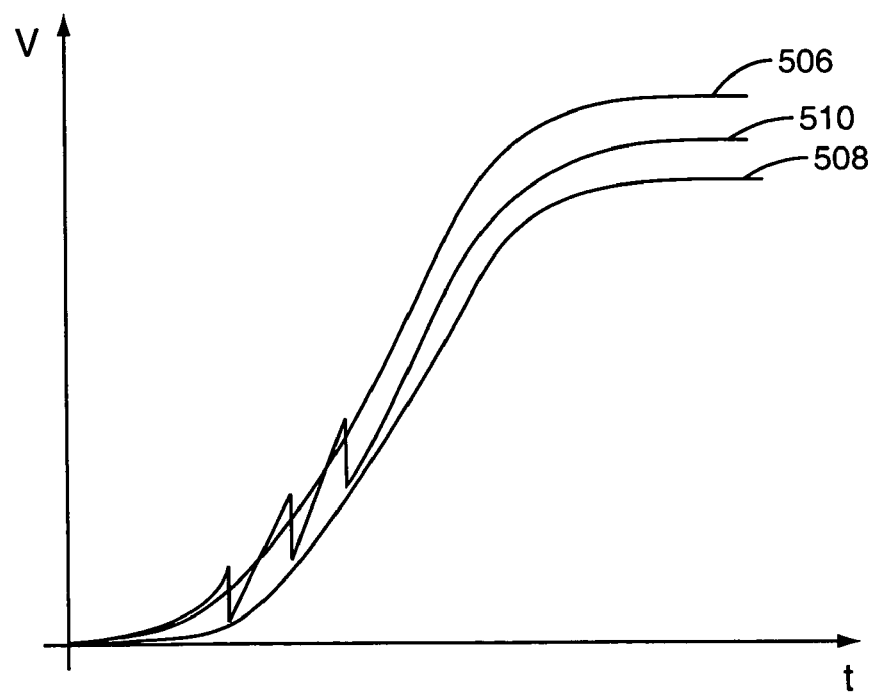

The operation of the over voltage detection and correction circuitry 114 is best described with respect to FIG. 5B. Note that the over voltage detection and correction circuitry 114 operates only during ramp-up for a transmit burst. Based on the ideal ramping signal ($V_{RAMP,IDEAL}$), the over voltage detection and correction circuitry 114 generates a maximum voltage ramp (line 506). An ideal voltage ramp (line 508) for the ideal load impedance is also illustrated. At numerous points in time during ramp-up, the over voltage detection and correction circuitry 114 compares the actual output voltage (line 510) to the maximum voltage ramp (line 506). If the output voltage (line 510) exceeds the maximum voltage ramp (line 506), the over voltage detection and correction circuitry 114 communicates with the PA ramp generator 116 (FIG. 3) to reduce the target output power by reducing the magnitude of the ramping signal ($V_{RAMP}$) with respect to the ideal ramping signal ($V_{RAMP,IDEAL}$), thereby reducing the output voltage (line 510). By operating only during ramp-up and correcting for over voltage using multiple steps, the over voltage detection and correction circuitry 114 ensures that any disturbances in the output radio frequency spectrum (ORFS) of the power amplifier circuitry 38 (FIG. 1) are small.

Returning to FIG. 3, the details of the over voltage detection and correction circuitry 114 will now be described. The over voltage detection and correction circuitry 114 includes scaling circuitry 138 and comparator 140. The scaling circuitry 138 provides the maximum voltage ramp (FIG. 5B) based on the ideal ramping signal ($V_{RAMP,IDEAL}$) and a digital representation of the battery voltage ($V_{BAT}$). In one embodiment, the scaling circuitry 138 multiplies the digital representation of the battery voltage ($V_{BAT}$), the ideal ramping signal ($V_{RAMP,IDEAL}$), and a predetermined scaling factor to provide the maximum voltage ramp (FIG. 5B, 506). The battery voltage ($V_{BAT}$) may be digitized by using the A/D converter 124 or a separate A/D converter. Note that the scaling circuitry 138 provides the maximum voltage ramp (FIG. 5B, 506) based on the ideal ramping signal ($V_{RAMP,IDEAL}$) rather than the output of the low-pass filter 136 because the comparator 140 compares the maximum voltage ramp to the digital power control signal (r'), where the digital power control signal (r') has not been filtered by the low-pass filter 92 (FIG. 2). Accordingly, the low-pass filter 136 is not needed to compensate for the inherent delay of the low-pass filter 92.

At numerous points in time during ramp-up, the comparator 140 compares the output of the scaling circuitry 138, which is the maximum voltage ramp, to the digital power control signal (r'), which corresponds to the corrected, or actual, voltage ramp (FIG. 5B, 510), from the time aligner 84 (FIG. 2). If the amplitude modulation signal (r') exceeds the maximum voltage ramp, the comparator 140 provides an over voltage signal (OVER VOLTAGE) to the PA ramp generator 116. In response, the PA ramp generator 116 reduces the target output power by reducing the magnitude of the ramping signal ($V_{RAMP}$) with respect to the magnitude of the ideal ramping signal ($V_{RAMP,IDEAL}$). The digital power control signal (r') is one example of a signal indicative of the output voltage of the power amplifier circuitry 38 (FIG. 1), and is not intended to limit the scope of the present invention. Various alternatives for generating or acquiring a signal indicative of the output voltage of the power amplifier circuitry 38 (FIG. 1) will be apparent to one of ordinary skill in the art upon reading this disclosure.

FIG. 3 also illustrates an exemplary embodiment of the PA ramp generator 116. In this embodiment, the PA ramp generator 116 reduces the target output power by multiplying the ideal ramping signal ($V_{RAMP,IDEAL}$) by a correction factor that is less than one to provide the ramping signal ($V_{RAMP}$). For example, when the comparator 134 detects a first over current condition or the comparator 140 detects a first over voltage condition, the correction factor may be changed from an initial value, such as 1, to a first value, such as 0.95. Thereafter, if a second over current or over voltage condition is detected during ramp-up, the correction factor may be reduced to 0.9. This process may repeat several times during ramp-up. For the next transmit burst, the correction value is initially set to 1. The values for the correction factor may be selectable or hard-coded, depending on the particular implementation.

More specifically, in this embodiment, the PA ramp generator 116 includes an ideal ramp generator 142, a multiplier 144, a counter 146, and an OR gate 148. The ideal ramp generator 142 provides the ideal ramping signal ($V_{RAMP,IDEAL}$) based on the ideal load. The multiplier 144 multiplies the ideal ramping signal ($V_{RAMP,IDEAL}$) by a correction factor to provide the ramping signal ($V_{RAMP}$). The correction factor is provided by the counter 146 based on a combination of the over current and over voltage signals (OVER CURRENT, OVER VOLTAGE) provided by the OR gate 148. Prior to or at the beginning of ramp-up for a transmit burst, the correction factor is set to 1 by resetting the counter 146. During ramp-up, if either an over current or over voltage condition is detected, the OR gate 148 provides a down-count signal (DN) to the counter 146. In response, the counter decrements the correction factor by a predetermined value. The predetermined value may be selectable or hard-coded.

In another embodiment, the PA ramp generator 116 reduces the target output power by subtracting a predetermined value from the ideal ramping signal ($V_{RAMP,IDEAL}$) when either an over current or an over voltage condition is detected to provide the ramping signal ($V_{RAMP}$). The predetermined value may be selectable or hard-coded, depending on the particular implementation.

One issue with the ramp generation and output power correction circuitry 74 of FIG. 3 is that the latency of the power control circuitry 40 (FIG. 1), the D/A converter 90 (FIG. 2), and the AND converter 124 cause the detected output power signal ($P_{OUT}$) to be delayed with respect to the desired output power signal ($P_{DESIRED}$). As a result, the amount of time needed for the output power correction circuitry 110 to adjust the ramping signal ($V_{RAMP}$) to achieve the target output power, which is hereafter referred to as the response time of the output power correction circuitry 110, is increased. Since ramp-up for a transmit burst may be on the order of 8 microseconds, it may be desirable to decrease the response time of the output power correction circuitry 110 such that that output power correction circuitry 110 operates to more quickly correct the output power during ramp-up.

Another issue with the ramp generation and output power correction circuitry 74 of FIG. 3 is that the integrator 122 tracks the trajectory of the ramping signal ($V_{RAMP}$). Thus, the output of the integrator 122 varies from zero to full-scale. In other words, the output of the integrator 122 is zero when the ramping signal ($V_{RAMP}$) is zero, and full-scale when the ramping signal ($V_{RAMP}$) is full-scale. As a result, the response time of the output power correction circuitry 110 may be relatively slow when compared to a ramp-up time of, for example, 8 microseconds.

Figure 6:
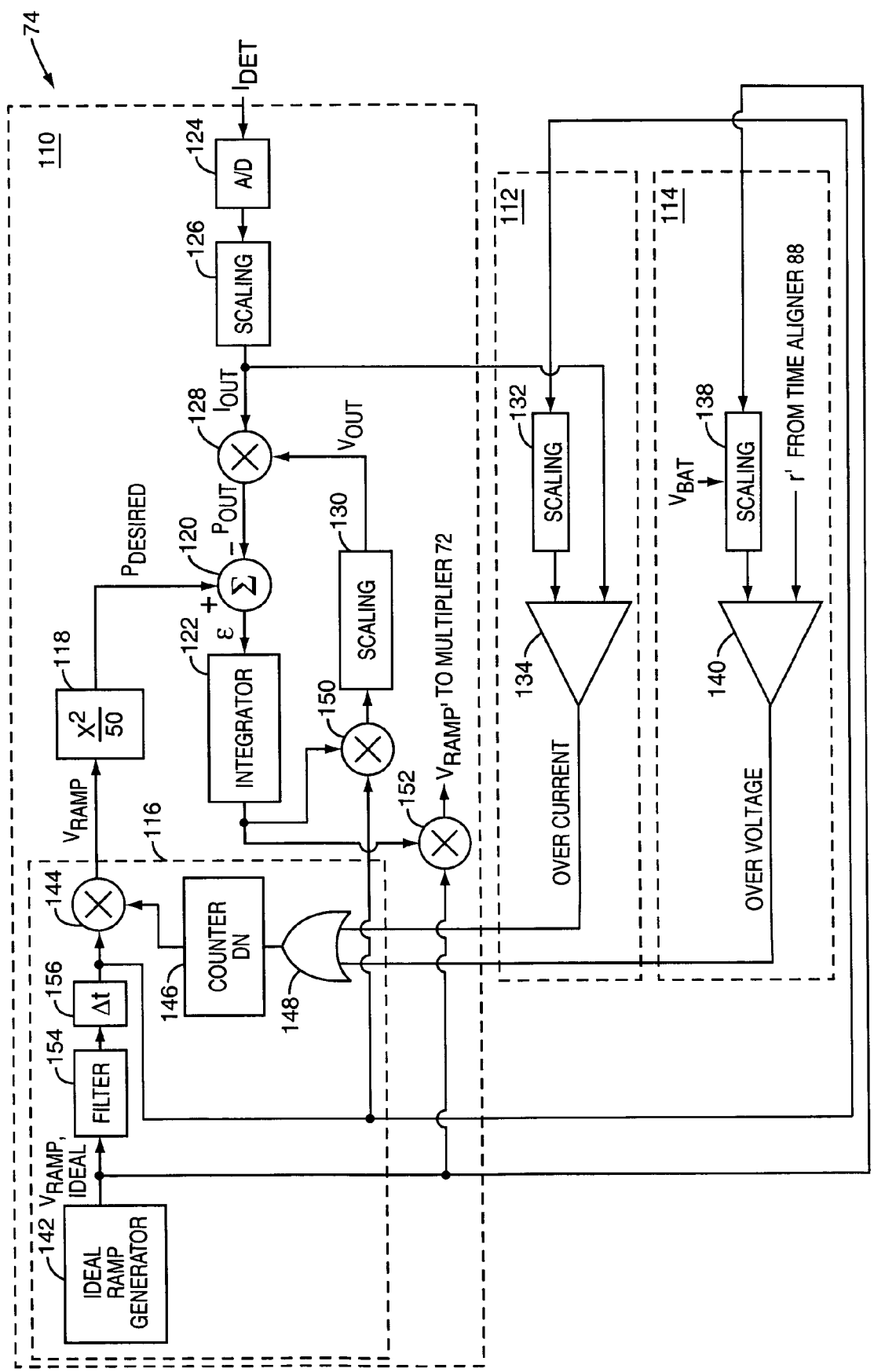
FIG. 6 illustrates the ramp generation and output power correction circuitry of FIG. 3 further including timing circuitry to correct for inherent delays.

FIG. 6 illustrates another embodiment of the ramp generation and output power correction circuitry 74 similar to the embodiment of FIG. 3 that resolves the two issues discussed above. In general, the ramp generation and output power correction circuitry 74 includes the output power correction circuitry 110, the over current detection and correction circuitry 112, and the over voltage detection and correction circuitry 114. However, in this embodiment, the output power correction circuitry 110 also includes filter 154 and delay ($\Delta t$) 156. As discussed above with respect to the low-pass filter 136 (FIG. 3), the filter 154 is a low-pass filter matched to the filter 92 (FIG. 2) in order to compensate for the inherent delay of the filter 92. The delay 156 operates to introduce a predetermined delay that compensates for the inherent delays of the D/A converter 90 (FIG. 2), the A/D converter 124, and the power control circuitry 40 (FIG. 1). By doing so, the desired power signal ($P_{DESIRED}$) is time aligned with the detected output power ($P_{OUT}$).

In addition, the output power correction circuitry 110 includes multipliers 150 and 152. Multipliers 150 and 152 may be generally referred to as combiners. The multiplier 150 operates to multiply the filtered, delayed ideal ramping signal ($V_{RAMP,IDEAL}$) from the output of the delay 156 and the output of the integrator 122 to provide a feedback signal to the scaling circuitry 130. The multiplier 152 operates to multiply the ideal ramping signal ($V_{RAMP,IDEAL}$) and the output of the integrator 122 to provide the corrected ramping signal ($V'_{RAMP}$). Note that the multiplier 152 operates based on the ideal ramping signal ($V_{RAMP,IDEAL}$), whereas multiplier 150 operates based on the filtered, delayed ideal ramping signal ($V_{RAMP,IDEAL}$). This is because it is desirable to time align the output voltage ($V_{OUT}$) with the desired output power signal ($P_{DESIRED}$). As for the multiplier 152, it is not desirable to use the filtered, delayed ideal ramping signal ($V_{RAMP,IDEAL}$) because this would double the latency of the modulator 36 (FIG. 2). This is because the latency of the filter 154 and delay 156 corresponds to the latency of the filter 92 (FIG. 2), D/A converter 90 (FIG. 2), power control circuitry 40 (FIG. 1), and the A/D converter 124 which already exist in the path between the corrected ramping signal ($V'_{RAMP}$) and multiplier 128.

As a result of the multipliers 150 and 152, the output of the integrator 122 tracks the error between $V_{RAMP,IDEAL}$ and the value of the corrected ramping signal ($V'_{RAMP}$) corresponding to the desired output power. In contrast, the integrator 122 of FIG. 3 tracks the entire trajectory of the ramping signal (VAMP) and varies from zero to full-scale. Accordingly, the response time of the output power correction circuitry 110 of FIG. 6 is substantially decreased as compared to the response time of the embodiment of FIG. 3.

Figure 7:
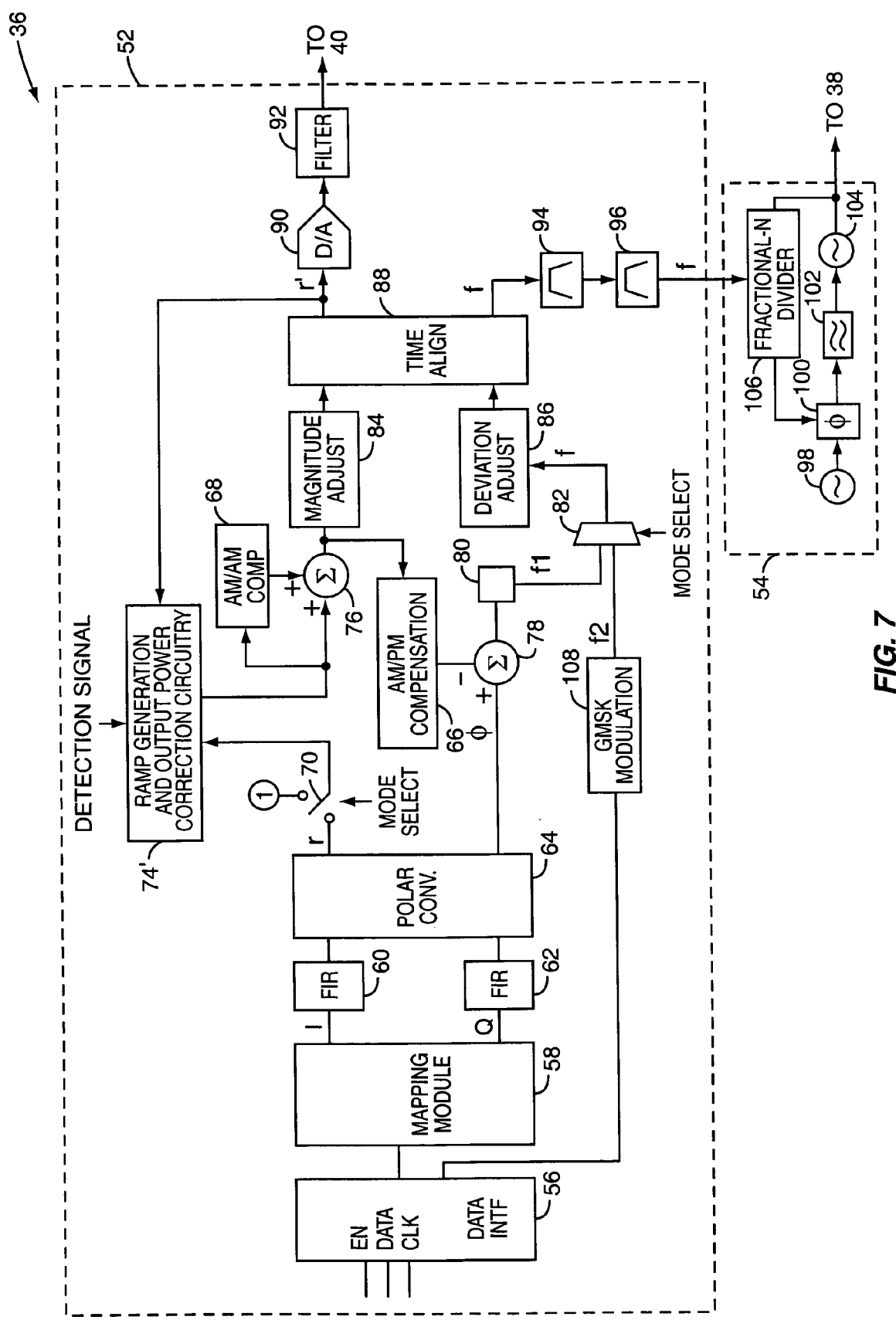
FIG. 7 illustrates another embodiment of the modulator of FIG. 2 according to another embodiment of the present invention.

FIG. 7 illustrates another embodiment of the modulator 36 similar to that shown in FIG. 2. Accordingly, the details of the modulator 36 discussed above with respect to FIG. 2 are equally applicable to the embodiment of FIG. 7. However, FIG. 7 illustrates an alternative embodiment of the ramp generation and output power correction circuitry 74' wherein the ramp generation and output power correction circuitry 74' operates during the entire transmit burst, rather than only during ramp-up. As illustrated, the ramp generation and output power correction circuitry 74' receives the output of the switch 70, which is referred to as the amplitude component. As discussed below in more detail, the ramp generation and output power correction circuitry 74' processes the amplitude component from the switch 70 to provide a corrected composite signal to the AM/AM compensation circuitry 68 and the summation circuitry 76.

Figure 8:
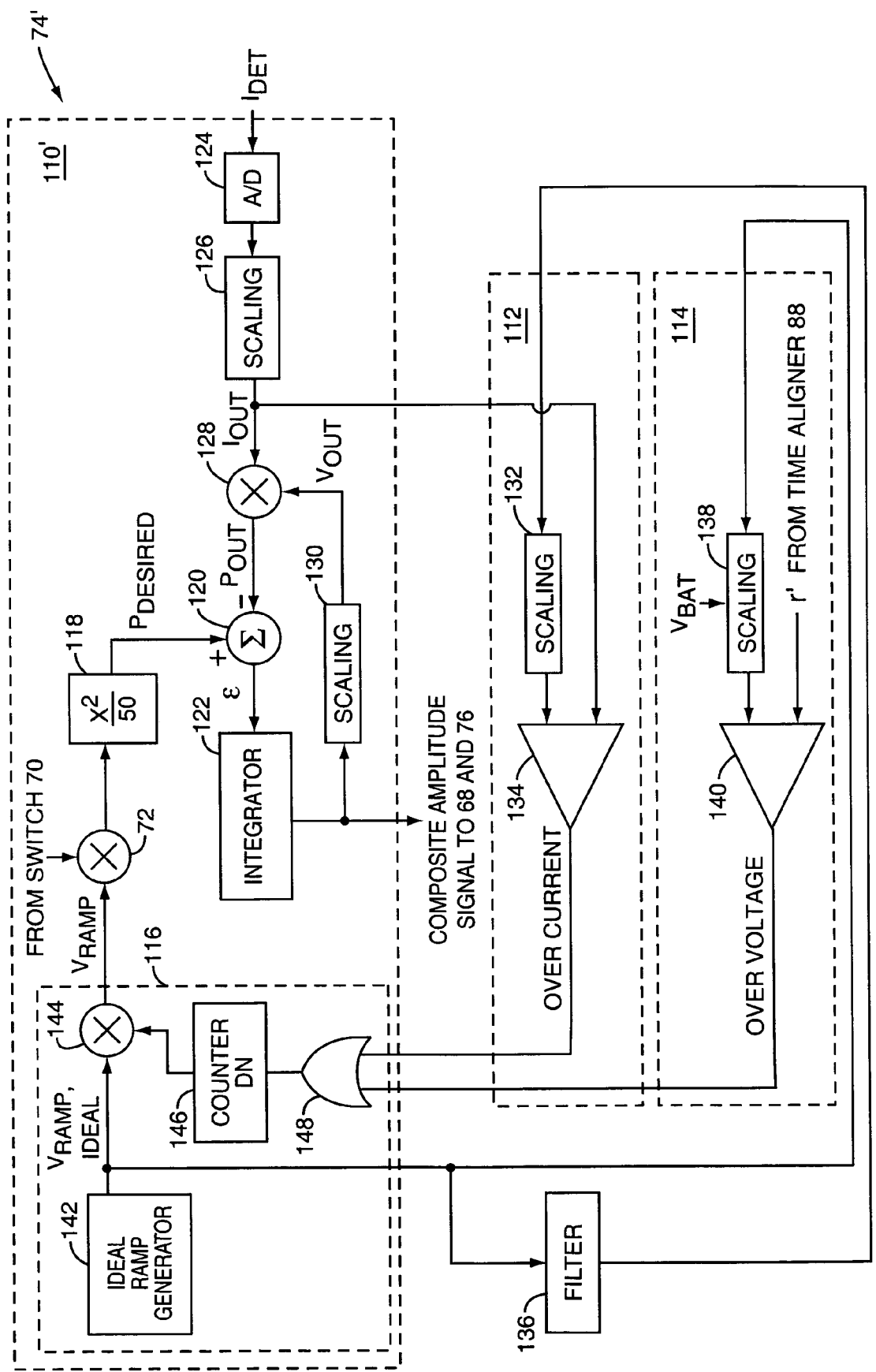
FIG. 8 illustrates the ramp generation and output power correction circuitry of FIG. 7 according to another embodiment of the present invention.

FIG. 8 is a detailed block diagram of one embodiment of the ramp generation and output power correction circuitry 74'. This embodiment operates substantially the same as the embodiment shown in FIG. 3. However, in this embodiment, the output power correction circuitry 110' operates during the entire transmit burst, rather than only during ramp-up as described above with respect to FIG. 3. More specifically, the multiplier 72 (FIG. 2) is included within the output power correction circuitry 110', and the output of the output power correction circuitry 110' is the corrected composite signal, which is provided to the AM/AM compensation circuitry 68 (FIG. 7) and the summation circuitry 76 (FIG. 7).

Accordingly, the output power correction circuitry 110' operates to provide the corrected composite signal such that the output power of the power amplifier circuitry 38 (FIG. 1) is essentially equal to the target output power. The power amplifier (PA) ramp generator 116 provides the ideal ramping signal ($V_{RAMP,IDEAL}$) and the ramping signal ($V_{RAMP}$). The ramping signal ($V_{RAMP}$) is equivalent to the ideal ramping signal ($V_{RAMP,IDEAL}$) when no over current or over voltage condition exists. However, if an over current or over voltage condition is detected, the ramping signal ($V_{RAMP}$) may be reduced such that it is less than the ideal ramping signal ($V_{RAMP,IDEAL}$). The multiplier 72 multiplies the ramping signal ($V_{RAMP}$) and the amplitude component (r) from the switch 70 (FIG. 7) to provide a composite signal. The composite signal is converted from a voltage to a desired output power signal ($P_{DESIRED}$) by conversion circuitry 118. From this point, the output power correction circuitry 108' operates as described above to provide the corrected composite signal.

As discussed above with respect to FIG. 3, one issue with the ramp generation and output power correction circuitry 74' of FIG. 8 is that the latency of the power control circuitry 40 (FIG. 1), the D/A converter 90 (FIG. 2), and the A/D converter 124 causes the detected output power signal ($P_{OUT}$) to be delayed with respect to the desired output power signal ($P_{DESIRED}$). As a result, the response time of the output power correction circuitry 110' is increased. Another issue with the ramp generation and output power correction circuitry 74' of FIG. 8 is that the integrator 122 must track the trajectory of the composite signal from the output of the multiplier 72 from zero to full-scale. As a result, the response time of the output power correction circuitry 110' may be relatively slow when compared to a ramp-up time of, for example, 8 microseconds and variations in the composite signal due to amplitude modulation during the transmit burst when in 8PSK mode.

Figure 9:
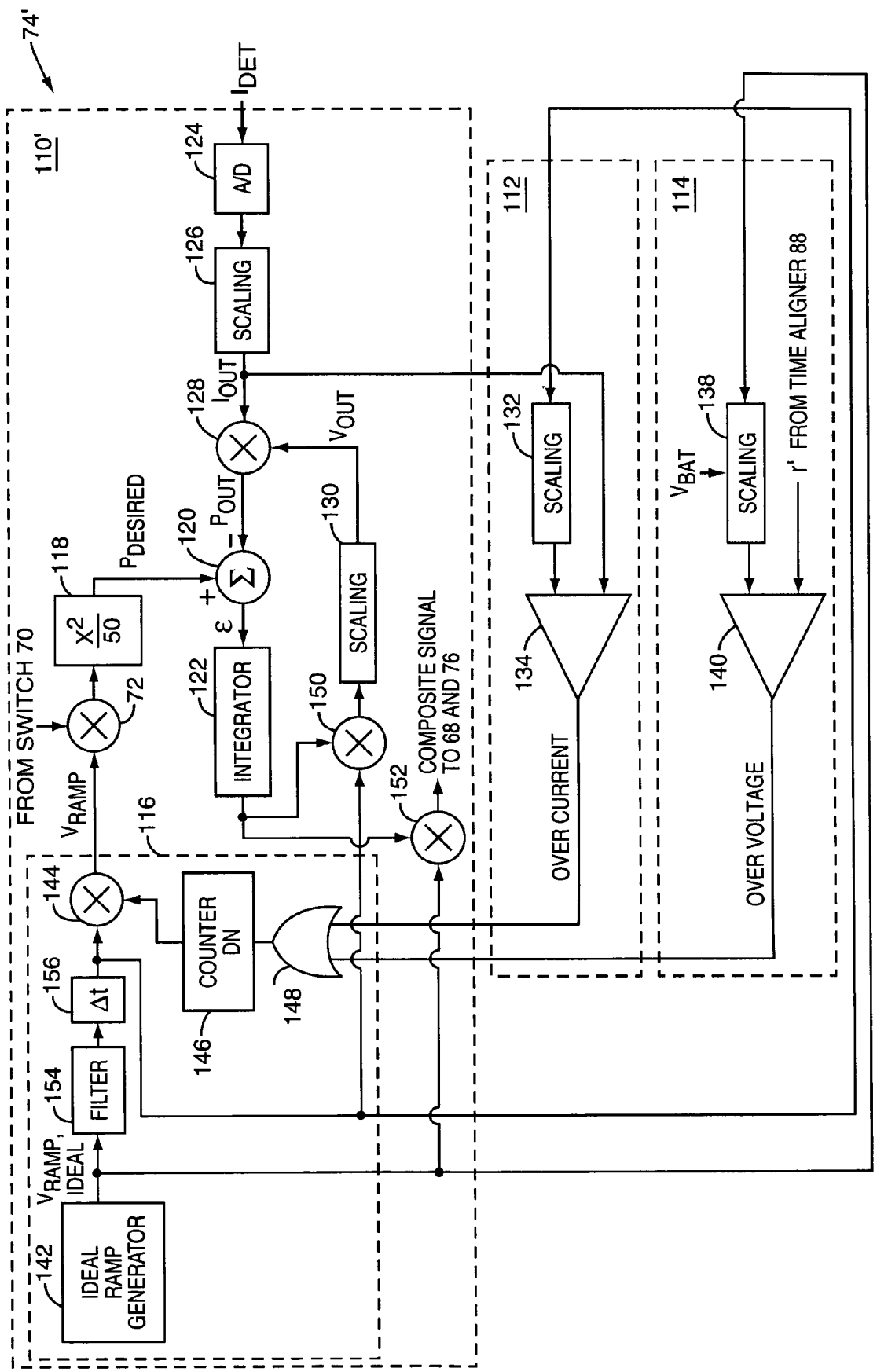
FIG. 9 illustrates the ramp generation and output power correction circuitry of FIG. 8 further including timing circuitry to correct for inherent delays.

FIG. 9 illustrates another embodiment of the ramp generation and output power correction circuitry 74' similar to the embodiment of FIG. 8 that resolves the two issues discussed above. In general, the ramp generation and output power correction circuitry 74' includes the output power correction circuitry 110', the over current detection and correction circuitry 112, and the over voltage detection and correction circuitry 114. However, in this embodiment, the output power correction circuitry 110' includes the filter 154 and the delay ($\Delta t$) 156. The filter 154 is a low-pass filter matched to the filter 92 (FIG. 7) in order to compensate for the inherent delay of the filter 92. The delay 156 operates to introduce a predetermined delay that compensates for the inherent delays of the D/A converter 90 (FIG. 7), the A/D converter 124, and the power control circuitry 40 (FIG. 1). By doing so, the desired power signal ($P_{DESIRED}$) is time aligned with the detected output power ($P_{OUT}$).

In addition, the output power correction circuitry 110' includes the multipliers 150 and 152. The multiplier 150 operates to multiply the filtered, delayed ideal ramping signal ($V_{RAMP,IDEAL}$) from the output of the delay 156 and the output of the integrator 122 to provide a feedback signal to the scaling circuitry 130. The multiplier 152 operates to multiply the ideal ramping signal ($V_{RAMP,IDEAL}$) and the output of the integrator 122 to provide the corrected composite signal. Note that the multiplier 152 operates based on the ideal ramping signal ($V_{RAMP,IDEAL}$), whereas the multiplier 150 operates based on the filtered, delayed ideal ramping signal ($V_{RAMP,IDEAL}$). This is because it is desirable to time align the output voltage ($V_{OUT}$) with the desired output power signal ($P_{DESIRED}$). As for the multiplier 152, it is not desirable to use the filtered, delayed ideal ramping signal ($V_{RAMP,IDEAL}$) because this would double the latency of the modulator 36 (FIG. 7). This is because the latency of the filter 154 and delay 156 corresponds to the latency of the filter 92 (FIG. 7), D/A converter 90 (FIG. 7), power control circuitry 40 (FIG. 1), and the A/D converter 124 which already exist in the path between the composite amplitude signal and the multiplier 128.

As a result of the multipliers 150 and 152, the output of the integrator 122 tracks the error between $V_{RAMP,IDEAL}$ and the value of the composite signal corresponding to the desired output power. In contrast, the integrator 122 of FIG. 8 tracks the trajectory of the composite signal output by the multiplier 72, and must therefore vary from zero to some maximum, or full-scale, value. Accordingly, the response time of the output power correction circuitry 110' of FIG. 9 is substantially decreased with respect to the response time of the embodiment of FIG. 8.

Figure 10:
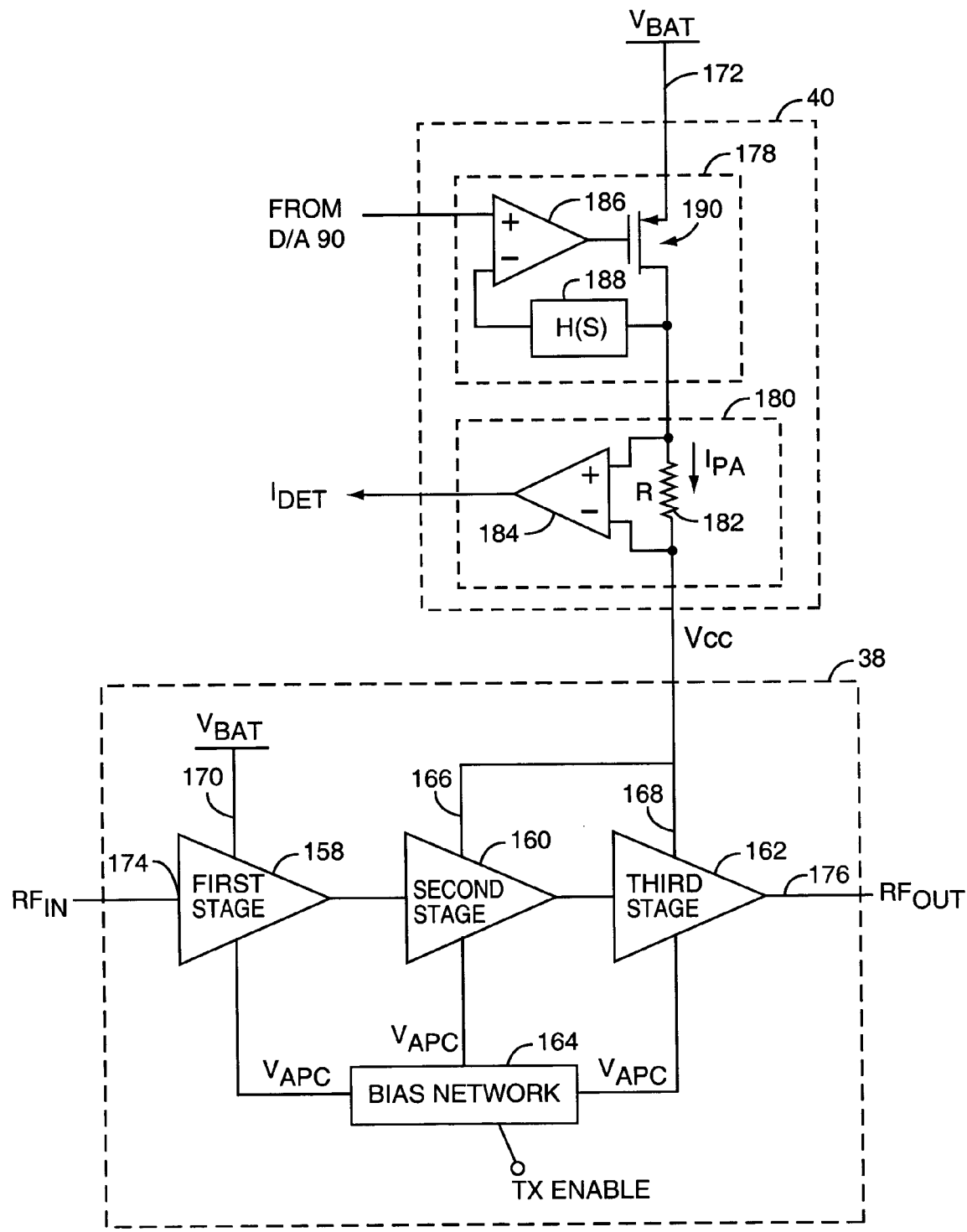
FIG. 10 illustrates a first exemplary embodiment of current detection circuitry for detecting an output current of a power amplifier according to one embodiment of the present invention.
Figure 11:
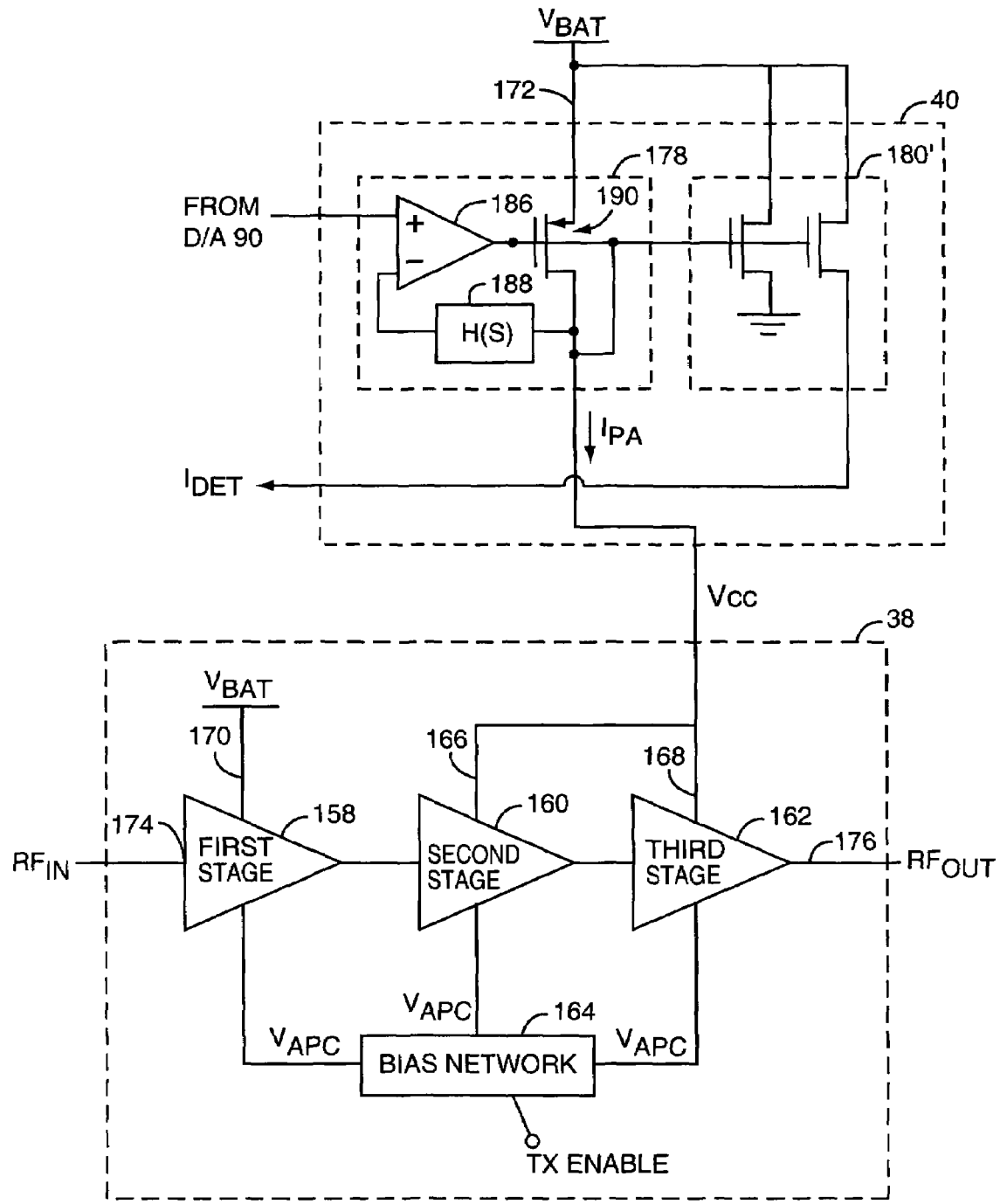
FIG. 11 illustrates a second exemplary embodiment of current detection circuitry for detecting an output current of a power amplifier according to one embodiment of the present invention.

FIGS. 10 and 11 illustrate exemplary embodiments of the power amplifier circuitry 38 and the power control circuitry 40 of FIG. 1, wherein the power control circuitry 40 provides the current detection signal ($I_{DET}$) to the ramp generation and output power correction circuitry 74 or 74' of FIGS. 3, 6, 8, or 9. Referring to FIG. 10, the power amplifier circuitry 38 is associated with the power control circuitry 40. In one embodiment, the power amplifier circuitry 38 and the power control circuitry 40 are incorporated into a single module. In this exemplary embodiment, the power amplifier circuitry 38 includes three amplifier stages, a first amplifier stage 158, a second amplifier stage 160, and a third amplifier stage 162, as well as a bias network 164 providing bias for each of the three amplifier stages 158, 160, 162.

The analog power control signal from the D/A converter 90 and filter 92 (FIGS. 2 and 7) is received by the power control circuitry 40 and used as a set-point voltage. Based on the analog power control signal, the power control circuitry 40 controls a supply voltage (Vcc) provided to the rails 166, 168 of the second and third amplifier stages 160, 162, respectively. These rails 166, 168 will typically be the collectors or drains of bipolar or field effect transistors forming the respective amplifier stages, as will be appreciated by those skilled in the art. It should be noted that, in an alternative embodiment, the supply voltage (Vcc) may be provided to the rails 170, 166, 168 of the first, second, and third amplifier stages 158, 160, 162, respectively. As another alternative, the supply voltage (Vcc) may be provided to the rails 170, 166 of the first and second amplifier stages 158, 160.

In this embodiment, the rail 170 of the first amplifier stage 158 is connected directly to a fixed or primary voltage supply ($V_{BAT}$), which will preferably also be connected to the terminal for the positive potential of a battery. The fixed or primary voltage supply ($V_{BAT}$) is also preferably connected to an input terminal 172 of the power control circuitry 40. As noted, in one embodiment, the bias network 164 supplies a fixed bias to the three amplifier stages 158, 160, 162, regardless of the collector/drain supply voltage (Vcc) provided to the second and third amplifier stages 160, 162.

The fixed bias incorporates traditional $V_{APC}$ signals, which are configured to maintain a constant bias. However, in another embodiment, the bias network 164 provides a constant bias to the first amplifier stage 158 and a variable bias that is reduced when the supply voltage (Vcc) is reduced to the second and third amplifier stages 160, 162.

The transmitter control signal (TX ENABLE) is a logic signal used to enable or disable the power amplifier circuitry 38 by removing the bias from each of the three amplifier stages 158, 160, 162. A radio frequency signal to be amplified ($RF_{IN}$), which is provided by the PLL 54 (FIGS. 2 and 7), is provided at the input 174 of the first amplifier stage 158 and amplified by the three amplifier stages 158, 160, 162 to provide an amplified output signal ($RF_{OUT}$) at the output 176 of the third amplifier stage 162.

It should be noted that the power control scheme discussed herein provides many benefits. For example, the supply voltage (Vcc) is preferably provided such that the second and third amplifier stages 160, 162 operate in saturation. As another example, by providing the fixed voltage ($V_{BAT}$) to the first amplifier stage 158, the overall output noise power is not increased when the output power of the power amplifier circuitry 38 is decreased. These benefits, along with the many other benefits of this power control scheme, are discussed in detail in U.S. Pat. No. 6,701,138, entitled POWER AMPLIFIER CONTROL, issued Mar. 2, 2004, which is assigned to RF Micro Devices, Inc. of 7628 Thorndike Road, Greensboro, N.C. 27409 and is hereby incorporated herein by reference in its entirety.

Certain advantages may be realized by forming two or more of the amplifier stages 158, 160, 162 from a plurality of transistor cells arranged in parallel. For further information pertaining to the transistor arrays, reference is made to U.S. Pat. Nos. 5,608,353, entitled HBT POWER AMPLIFIER, issued Mar. 4, 1997; and 5,629,648, entitled HBT POWER AMPLIFIER, issued May 13, 1997, which are assigned to RF Micro Devices, Inc. of 7628 Thorndike Road, Greensboro, N.C. 27409, and wherein the disclosures are incorporated herein by reference in their entireties. Still further information may be found in commonly owned U.S. Patent Application Publication No. 2003/0054778, entitled AMPLIFIER POWER DETECTION CIRCUITRY, published Mar. 20, 2003, the disclosure of which is hereby incorporated by reference in its entirety. Exemplary bias networks 146 capable of being used in association with the present invention are described in further detail in U.S. Pat. No. 6,313,705, entitled BIAS NETWORK FOR HIGH EFFICIENCY RF LINEAR AMPLIFIER, issued Nov. 6, 2001, which is also assigned to RF Micro Devices, Inc. and is hereby incorporated by reference in its entirety. Upon understanding the present invention, those skilled in the art will be able to construct any number of bias networks that are compatible with the present invention.

The power control circuitry 40 includes a voltage regulator 178 and current detection circuitry 180. More specifically, the exemplary embodiment of the current detection circuitry 180 includes a resistor 182 and an amplifier 184. The resistor 182 may be a bond wire coupling an output terminal of the power control circuitry 40 to an input of the power amplifier circuitry 38. However, the resistor 182 may be any resistive element coupling the voltage regulator 178 to the power amplifier circuitry 38. The amplifier 184 operates to provide the current detection signal ($I_{DET}$) indicative of the actual current ($I_{PA}$) based on a voltage differential across the resistor 182.

FIG. 10 also illustrates an exemplary embodiment of the voltage regulator 178 previously disclosed in U.S. Pat. No.

6,701,138, which has been incorporated herein by reference in its entirety, wherein the voltage regulator 178 is a Low Dropout (LDO) voltage regulator. For a detailed discussion of the LDO voltage regulator, see U.S. Pat. No. 6,701,138. In general, the voltage regulator 178 includes an error amplifier 186, a feedback network 188, and a series pass element 190. In this embodiment, the series pass element 190 is a p-FET. The analog power control signal may be received by a negative input (−) of an operational amplifier forming the error amplifier 186. The output of the series pass element 190 is fed back through the feedback network 188 and received by positive input (+) of the error amplifier 186. An output signal from error amplifier 186 is provided to a control input of the series pass element 190 that controls the regulated output of voltage regulator 178.

In an alternative embodiment, the voltage regulator 178 may be a switching DC/DC converter, as described in commonly owned and assigned U.S. patent application Ser. No. 10/920,073, entitled POWER AMPLIFIER CONTROL USING A SWITCHING POWER SUPPLY, filed Aug. 17, 2004, which is hereby incorporated herein by reference in its entirety. In another alternative embodiment, the voltage regulator 178 may be configurable as either an LDO voltage regulator or a switching DC/DC converter, as described in commonly owned and assigned U.S. patent application Ser. No. 11/002,473, entitled RECONFIGURABLE POWER CONTROL FOR A MOBILE TERMINAL, filed Dec. 2, 2004, which is hereby incorporated herein by reference in its entirety.

FIG. 11 illustrates another embodiment of the power control circuitry 40 of the present invention. This embodiment is substantially the same as the embodiment of FIG. 10. However, in this embodiment, the current detection circuitry 180 is a current mirror 180'. The operation of the current mirror 180' will be apparent to one of ordinary skill in the art upon reading this disclosure. In general, the current mirror 180' generates the current detection signal ($I_{DET}$) based on the actual current ($I_{PA}$) through the series pass element 190 of the voltage regulator 178. The current mirror 180' provides the additional advantage of not adding a voltage drop, such as the voltage drop across the resistor 182 of FIG. 10, and is easily implemented in CMOS technology.

FIG. 12 illustrates another embodiment of the power amplifier circuitry 38 and the power control circuitry 40, where both a power detection signal ($P_{DET}$) and the current detection signal ($I_{DET}$) are provided to the ramp generation and output power correction circuitry 74 or 74' (FIGS. 3, 6, 8, and 9). The power detection signal ($P_{DET}$) is provided to the ramp generation and output power correction circuitry 74 or 74', and more specifically to the output power correction circuitry 110 or 110', by a directional coupler 192. The details of the directional coupler 192 will be apparent to one of ordinary skill in the art upon reading this disclosure. Note that because the power detection signal ($P_{DET}$) is indicative of the output power, the multiplier 128 and scaling circuitry 130 (FIGS. 3, 6, 8, and 9) are not needed because the power detection signal ($P_{DET}$) does not need to be converted from current to power. However, the scaling circuitry 126 may be needed depending on the particular design of the directional coupler 192. As discussed above, the current detection signal ($I_{DET}$) is provided to the over current detection and correction circuitry 112.

FIGS. 10-12 are exemplary embodiments illustrating how the detection signal (DETECTION SIGNAL) provided to the ramp generation and output power correction circuitry 74 or 74' (FIGS. 3, 6, 8, and 9) is generated and are not intended to limit the scope of the present invention. Various alternatives for generating the detection signal (DETECTION SIGNAL) as either a current or power detection signal will be apparent to one of ordinary skill in the art upon reading this disclosure.

The present invention provides substantial opportunity for variation without departing from the spirit or scope of the present invention. For example, FIGS. 3, 6, 8, and 9 illustrate embodiments of the ramp generation and output power control circuitry 74 or 74'. Each of these embodiments illustrate the output power correction circuitry 110 or 110', the over current detection and correction circuitry 112, and the over voltage detection and correction circuitry 114. However, alternative embodiments of the ramp generation and output power correction circuitry 74 or 74' may only include the output power correction circuitry 110 or 110'. Referring to FIGS. 6 and 9, for these alternative embodiments, the ideal ramping signal ($V_{RAMP,IDEAL}$) is filtered and delayed by the filter 154 and delay 156 to provide the ramping signal ($V_{RAMP}$). Since these alternative embodiments do not include the over current and over voltage detection and correction circuitries 112 and 114, the multiplier 144 would not be included in these alternative embodiments.

Those skilled in the art will recognize improvements and modifications to the preferred embodiments of the present invention. All such improvements and modifications are considered within the scope of the concepts disclosed herein and the claims that follow.

What is claimed is:

1. A transmit system for a mobile terminal comprising:
power amplifier circuitry adapted to amplify a radio frequency input signal based on a variable supply voltage;
power control circuitry adapted to provide the variable supply voltage based on a power control signal; and
output power correction circuitry comprising:
   a power amplifier ramp generator adapted to provide a ramping signal;
   conversion circuitry adapted to convert the ramping signal into a desired output power signal;
   difference circuitry adapted to provide an error signal based on a difference between the desired output power signal and a detected output power signal;
   integration circuitry adapted to integrate the error signal to provide an adjustment signal; and
   first combiner circuitry adapted to combine the adjustment signal and an ideal ramping signal to provide a corrected ramping signal;
wherein the power control signal is provided based on the corrected ramping signal.

2. The system of claim 1 wherein the power amplifier ramp generator comprises:
an ideal ramp generator adapted to provide the ideal ramping signal; and
time alignment circuitry adapted to delay the ideal ramping signal to provide the ramping signal such that the desired output power signal is essentially time aligned with the detected output power signal.

3. The system of claim 2 further comprising digital modulation circuitry adapted to provide a digital power control signal based on multiplying the corrected ramping signal and an amplitude modulation component of a modulated signal, wherein the digital modulation circuitry comprises a digital-to-analog converter adapted to provide a Pulse Width Modulated (PWM) digital signal based on the digital power control signal and first filtering circuitry adapted to filter the PWM digital signal to provide the power control signal.

4. The system of claim 3 wherein the time alignment circuitry comprises:
second filtering circuitry matched to the first filtering circuitry adapted to filter the ideal ramping signal to provide a filtered ideal ramping signal; and
delay circuitry adapted to delay the filtered ideal ramping signal by a predetermined time delay to provide the ramping signal;
wherein the second filtering circuitry and the delay circuitry operate to delay the ideal ramping signal to provide the ramping signal such that the desired output power signal is essentially time aligned with the detected output power signal.

5. The system of claim 2 wherein the output power correction circuitry further comprises first multiplier circuitry adapted to multiply a detected output current signal and an output voltage signal to provide the detected output power signal.

6. The system of claim 5 wherein the output power correction circuitry further comprises:
second combiner circuitry adapted to combine the adjustment signal and the ramping signal to provide an output signal; and
scaling circuitry adapted to scale the output signal to provide the output voltage signal;
wherein the output voltage signal is provided based on the ramping signal such that the output voltage signal is essentially time aligned with the detected output current signal.

7. The system of claim 1 further comprising:
over current detection and correction circuitry adapted to:
compare a detected output current signal indicative of an output current of the power amplifier circuitry to a maximum current ramp during ramp-up for a transmit burst; and
control the power amplifier ramp generator such that a magnitude of the ramping signal is reduced to reduce an output power of the power amplifier circuitry if the detected output current signal exceeds the maximum current ramp during ramp-up for the transmit burst.

8. The system of claim 7 wherein the over current detection and correction circuitry comprises:
scaling circuitry adapted to provide the maximum current ramp based on the ideal ramping signal; and
comparison circuitry adapted to compare the detected output current signal to the maximum current ramp during ramp-up for the transmit burst and control the power amplifier ramp generator to reduce the magnitude of the ramping signal if the detected output current signal exceeds the maximum current ramp during ramp-up for the transmit burst.

9. The system of claim 8 wherein the over current detection and correction circuitry is further adapted to:
compare the detected output current signal to the maximum current ramp at a plurality of points in time during ramp-up for the transmit burst; and
for each comparison of the detected output current signal and the maximum current ramp, adjust the power control signal to reduce the output power of the power amplifier circuitry if the detected output current signal exceeds the maximum current ramp.

10. The system of claim 7 further comprising:
over voltage detection and correction circuitry adapted to:
compare a voltage detection signal indicative of an output voltage of the power amplifier circuitry to a maximum voltage ramp during ramp-up for the transmit burst; and
control the power amplifier ramp generator such that a magnitude of the ramping signal is reduced to reduce the output power of the power amplifier circuitry if the voltage detection signal exceeds the maximum voltage ramp.

11. The system of claim 10 wherein the over voltage detection and correction circuitry comprises:
scaling circuitry adapted to provide the maximum voltage ramp based on the ideal ramping signal and a source voltage of a power source of the mobile terminal; and
comparison circuitry adapted to compare the voltage detection signal to the maximum voltage ramp during ramp-up for the transmit burst and control the power amplifier ramp generator to reduce the magnitude of the ramping signal if the voltage detection signal exceeds the maximum voltage ramp during ramp-up for the transmit burst.

12. The system of claim 11 wherein the over voltage detection and correction circuitry is further adapted to:
compare the voltage detection signal to the maximum voltage ramp at a plurality of points in time during ramp-up for the transmit burst; and
for each comparison of the voltage detection signal and the maximum voltage ramp, adjust the power control signal to reduce the output power of the power amplifier circuitry if the voltage detection signal exceeds the maximum voltage ramp.

13. The system of claim 10 wherein the power amplifier ramp generator comprises:
an ideal ramp generator adapted to provide the ideal ramping signal;
time alignment circuitry adapted to delay the ideal ramping signal to provide a delayed ideal ramping signal such that the desired output power signal is essentially time aligned with the detected output power signal;
second combiner circuitry adapted to combine the delayed ideal ramping signal and a correction factor to provide the ramping signal; and
counter circuitry adapted to provide the correction factor, wherein the correction factor is adjusted by the over current detection and correction circuitry and the over voltage detection and correction circuitry.

14. The system of claim 13 further comprising digital modulation circuitry adapted to provide a digital power control signal based on multiplying the corrected ramping signal and an amplitude modulation component of a modulated signal, wherein the digital modulation circuitry comprises a digital-to-analog converter adapted to provide a Pulse Width Modulated (PWM) digital signal based on the digital power control signal and first filtering circuitry adapted to filter the PWM digital signal to provide the power control signal.

15. The system of claim 14 wherein the time alignment circuitry comprises:
second filtering circuitry matched to the first filtering circuitry adapted to filter the ideal ramping signal to provide a filtered ideal ramping signal; and
delay circuitry adapted to delay the filtered ideal ramping signal by a predetermined time delay to provide the ramping signal;

wherein the second filtering circuitry and the delay circuitry operate to delay the ideal ramping signal to provide the ramping signal such that the desired output power signal is essentially time aligned with the detected output power signal.

16. The system of claim 13 wherein the output power correction circuitry further comprises multiplier circuitry adapted to multiply a detected output current signal and an output voltage signal to provide the detected output power signal.

17. The system of claim 16 wherein the output power correction circuitry further comprises:
   third combiner circuitry adapted to combine the adjustment signal and the delayed ideal ramping signal to provide an output signal; and
   scaling circuitry adapted to scale the output signal to provide the output voltage signal;
   wherein the output voltage signal is provided based on the delayed ideal ramping signal such that the output voltage signal is essentially time aligned with the detected output current signal.

18. A transmit system for a mobile terminal comprising:
   power amplifier circuitry adapted to amplify a radio frequency input signal based on a variable supply voltage;
   power control circuitry adapted to provide the variable supply voltage based on a power control signal; and
   output power correction circuitry comprising:
      a power amplifier ramp generator adapted to provide a ramping signal;
      first combiner circuitry adapted to combine the ramping signal and an amplitude modulation component of a modulated signal to provide a composite signal;
      conversion circuitry adapted to convert the composite signal into a desired output power signal;
      difference circuitry adapted to provide an error signal based on a difference between the desired output power signal and a detected output power signal;
      integration circuitry adapted to integrate the error signal to provide an adjustment signal; and
      second combiner circuitry adapted to combine the adjustment signal and an ideal ramping signal to provide a corrected composite signal;
   wherein the power control signal is provided based on the corrected composite signal.

19. The system of claim 18 wherein the power amplifier ramp generator comprises:
   an ideal ramp generator adapted to provide the ideal ramping signal; and
   time alignment circuitry adapted to delay the ideal ramping signal to provide the ramping signal such that the desired output power signal is essentially time aligned with the detected output power signal.

20. A method for correcting an output power of a power amplifier in a transmit system for a mobile terminal comprising:
   amplifying a radio frequency input signal based on a variable supply voltage;
   providing the variable supply voltage based on a power control signal;
   providing a ramping signal and an ideal ramping signal;
   converting the ramping signal into a desired output power signal;
   providing an error signal based on a difference between the desired output power signal and a detected output power signal;
   integrating the error signal to provide an adjustment signal;
   combining the adjustment signal and the ideal ramping signal to provide a corrected ramping signal; and
   providing the power control signal based on a combination of an amplitude modulation component of a modulated signal and the corrected ramping signal.

* * * * *

UNITED STATES PATENT AND TRADEMARK OFFICE
Certificate

Patent No. 7,333,781 B2                                                             Patented: February 19, 2008

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Troy Stockstad, Chandler, AZ (US); Alexander Wayne Hietala, Phoenix, AZ (US); and Ulrik Riis Madsen, Herning (DK).

Signed and Sealed this Fifteenth Day of April 2008.

EDWARD URBAN
*Supervisory Patent Examiner*
Art Unit 2618